United States Patent
Wen et al.

(10) Patent No.: US 10,167,550 B2
(45) Date of Patent: Jan. 1, 2019

(54) MULTI-FUNCTIONAL COMPOSITE STRUCTURES

(71) Applicant: Aurora Flight Sciences Corporation, Manassas, VA (US)

(72) Inventors: Ed Wen, Manassas, VA (US); Dan Cottrell, Manassas, VA (US); Adam Ehrmantraut, Manassas, VA (US); Mark Blehar, Manassas, VA (US); David Kordonowy, Manassas, VA (US)

(73) Assignee: Aurora Flight Sciences Corporation, Manassas, VA (US)

( * ) Notice: Subject to any disclaimer, the term of this patent is extended or adjusted under 35 U.S.C. 154(b) by 127 days.

(21) Appl. No.: 14/726,964

(22) Filed: Jun. 1, 2015

(65) Prior Publication Data

US 2016/0343467 A1 Nov. 24, 2016

Related U.S. Application Data

(60) Provisional application No. 62/007,373, filed on Jun. 3, 2014.

(51) Int. Cl.
*H01B 7/00* (2006.01)
*C23C 16/06* (2006.01)
(Continued)

(52) U.S. Cl.
CPC ............ *C23C 16/06* (2013.01); *B29C 70/885* (2013.01); *B64C 3/26* (2013.01); *H01B 7/0018* (2013.01);
(Continued)

(58) Field of Classification Search
CPC .. B64C 3/20; B64C 3/26; B64C 3/185; H01B 7/0045; H01B 13/01209; H01B 7/0018;
(Continued)

(56) References Cited

U.S. PATENT DOCUMENTS

| | | | |
|---|---|---|---|
| 3,612,744 A * | 10/1971 | Thomas | ................. H01B 11/20 174/117 FF |
| 4,352,142 A | 9/1982 | Olson | |

(Continued)

FOREIGN PATENT DOCUMENTS

| | | |
|---|---|---|
| WO | WO91/11891 | 8/1991 |
| WO | WO2011/064707 | 6/2011 |
| WO | WO2012/159608 | 11/2012 |

OTHER PUBLICATIONS

Lin, Mark, et al., The Manufacture of Composite Structures with a Built-in Network of Piezoceramics, Composites Science and Technology 62 (2002) 919-939.

(Continued)

*Primary Examiner* — Steven T Sawyer
*Assistant Examiner* — Paresh Paghadal
(74) *Attorney, Agent, or Firm* — Michael Stanley Tomsa; McAndrews, Held & Malloy, Ltd.; Eugene H. Nahm

(57) ABSTRACT

A multi-functional composite system generally comprises a core, a plurality of structural composite fiber layers, a matrix material, a connector configured to interface with one or more electrical devices and a composite conductor assembly, the composite conductor assembly having one or more conductors disposed between two or more insulating layers.

25 Claims, 14 Drawing Sheets

(51) Int. Cl.
| | |
|---|---|
| B64C 3/26 | (2006.01) |
| H01B 7/08 | (2006.01) |
| B29C 70/88 | (2006.01) |
| B64C 3/20 | (2006.01) |
| B64C 3/18 | (2006.01) |
| B64D 45/00 | (2006.01) |
| H05K 1/03 | (2006.01) |
| H05K 3/28 | (2006.01) |
| H05K 3/32 | (2006.01) |
| B29L 31/30 | (2006.01) |

(52) U.S. Cl.
CPC .... *H01B 7/0823* (2013.01); *B29L 2031/3076* (2013.01); *B64C 3/185* (2013.01); *B64C 3/20* (2013.01); *B64D 45/00* (2013.01); *H01B 7/0838* (2013.01); *H01B 7/0861* (2013.01); *H01L 2924/01079* (2013.01); *H01L 2924/14* (2013.01); *H05K 1/0393* (2013.01); *H05K 3/281* (2013.01); *H05K 3/321* (2013.01)

(58) Field of Classification Search
CPC .. H01B 7/0838; H01B 7/0823; H01B 7/0861; C23C 16/06; B64D 45/00; H05B 2214/02; H05B 2214/04; B60R 16/0215; B60R 16/0207; H02G 11/00; H05K 3/028; H05K 3/281; H05K 3/321; H05K 3/323; H01L 2924/01079; H01L 2924/14
See application file for complete search history.

(56) References Cited

U.S. PATENT DOCUMENTS

| | | | |
|---|---|---|---|
| 4,537,469 A * | 8/1985 | Kircher | B64C 1/06 356/44 |
| 4,560,428 A | 12/1985 | Sherrick et al. | |
| 4,937,125 A | 6/1990 | Sanmartin et al. | |
| 5,412,181 A | 5/1995 | Giamati | |
| 5,656,231 A | 8/1997 | Blackmore | |
| 5,925,275 A | 7/1999 | Lawson et al. | |
| 5,971,323 A | 10/1999 | Rauch et al. | |
| 6,137,083 A | 10/2000 | Bost et al. | |
| 6,227,492 B1 | 5/2001 | Schellhase et al. | |
| 6,320,118 B1 | 11/2001 | Pridham et al. | |
| 6,440,521 B1 | 8/2002 | Moore | |
| 6,743,504 B1 | 6/2004 | Allen et al. | |
| 6,927,362 B2 | 8/2005 | Haluschka et al. | |
| 7,039,276 B2 * | 5/2006 | Aldridge | B64D 43/00 385/39 |
| 7,064,302 B2 | 6/2006 | Brunner et al. | |
| 7,157,663 B1 | 1/2007 | Kismarton | |
| 7,391,622 B2 | 6/2008 | Marshall et al. | |
| 7,777,162 B2 | 8/2010 | Park | |
| 8,240,982 B2 | 8/2012 | Vauchel | |
| 8,937,254 B2 | 1/2015 | Wen et al. | |
| 2005/0062024 A1 | 3/2005 | Bessette et al. | |
| 2007/0223205 A1* | 9/2007 | Liang | H05K 1/0245 361/760 |
| 2007/0259135 A1 | 11/2007 | Hascalovich et al. | |
| 2008/0277057 A1 | 11/2008 | Montgomery et al. | |
| 2009/0149997 A1 | 6/2009 | Stothers | |
| 2009/0289232 A1* | 11/2009 | Rice | F01D 17/20 252/511 |
| 2010/0051471 A1 | 3/2010 | Meng et al. | |
| 2010/0170746 A1 | 7/2010 | Restuccia et al. | |
| 2011/0011627 A1* | 1/2011 | Aspas Puertolas | H05K 1/142 174/251 |
| 2011/0120748 A1* | 5/2011 | Bailey | H01B 7/0838 174/117 F |
| 2011/0180524 A1 | 7/2011 | Brittingham et al. | |
| 2011/0272082 A1 | 11/2011 | Dunleavy et al. | |
| 2011/0290784 A1 | 12/2011 | Orawetz et al. | |
| 2011/0290786 A1 | 12/2011 | Hu et al. | |
| 2012/0103685 A1* | 5/2012 | Blanchard | H02G 3/0431 174/72 A |
| 2012/0132634 A1 | 5/2012 | Song | |
| 2012/0197482 A1 | 8/2012 | Moser et al. | |
| 2013/0043342 A1 | 2/2013 | Nordin et al. | |
| 2013/0068747 A1 | 3/2013 | Armatorio et al. | |
| 2013/0160462 A1 | 6/2013 | Broughton et al. | |
| 2013/0227952 A1 | 9/2013 | Grip et al. | |
| 2013/0319727 A1 | 12/2013 | Wen et al. | |
| 2014/0014640 A1 | 1/2014 | Calder et al. | |
| 2014/0070054 A1 | 3/2014 | Burton et al. | |
| 2014/0234552 A1 | 8/2014 | Frankenberger | |
| 2016/0302264 A1 | 10/2016 | Kessler et al. | |
| 2016/0343467 A1 | 11/2016 | Wen et al. | |

OTHER PUBLICATIONS

Sloan, Jeff, 787 Integrates New Composite Wing Deicing System, Case Study Post: Dec. 30, 2008, downloaded at http://www.compositesworld.com/articles/787-integrates-new-composite-wing-deicing-system.

Athanasopoulos, N., et al., "A Study on the Effect of Joule-Heating During the Liquid Composite Molding (LCM) Process and on the Curing of CFRP Composite Laminates," The 10th International Conference on Flow Processes in Composite Materials (FPCM10) Monte Verita, Ascona, CH—Jul. 11-15, 2010.

Athanasopoulos, N., et al., "Resistive heating of multidirectional and unidirectional dry carbon fibre preforms," Composites Science and Technology 72 (2012) 1273-1282, Available online May 7, 2012.

Hayes, S. A., "Inherent Cure of Carbon Fibre Composites Using their Electrical Resistance," The 19th International Conference on Composite Materials.

Joseph, Christopher, et al., "Electrical resistance curing of carbon-fibre/epoxy composites," Composites Science and Technology 60 (2000) 315-319, Accepted Aug. 4, 1999.

Kim, Yoon Jin, et al., "Electrical conductivity of chemically modified multiwalled carbon nanotube/epoxy composites," Carbon 43 (2005) 23-30, Available online Oct. 18, 2004.

Martin, C.A., et al., "Electric field-induced aligned multi-wall carbon nanotube networks in epoxy composites," Polymer 46 (2005) 877-886, Available online Dec. 15, 2004.

Mas, Bartolome, et al., Thermoset curing through Joule heating of nanocarbons for composite manufacture, repair and soldering, Carbon 63 (2013) 523-529, Available online Jul. 15, 2013.

Rider, A.N., et al., "Internal resistance heating for homogeneous curing of adhesively bonded repairs," International Journal of Adhesion & Adhesives 31 (3011) 168-176, Available online Jan. 7, 2011.

Nicholas Patz, Patz Materials & Technologies: PMT-F4, Aug. 1, 2011.

Heyward Burnette, "SBIR Program Yields Lightweight, Highly Conductive Electromagnetic Shielding Coatings", Air Force Print News Today, Sep. 14, 2010.

* cited by examiner

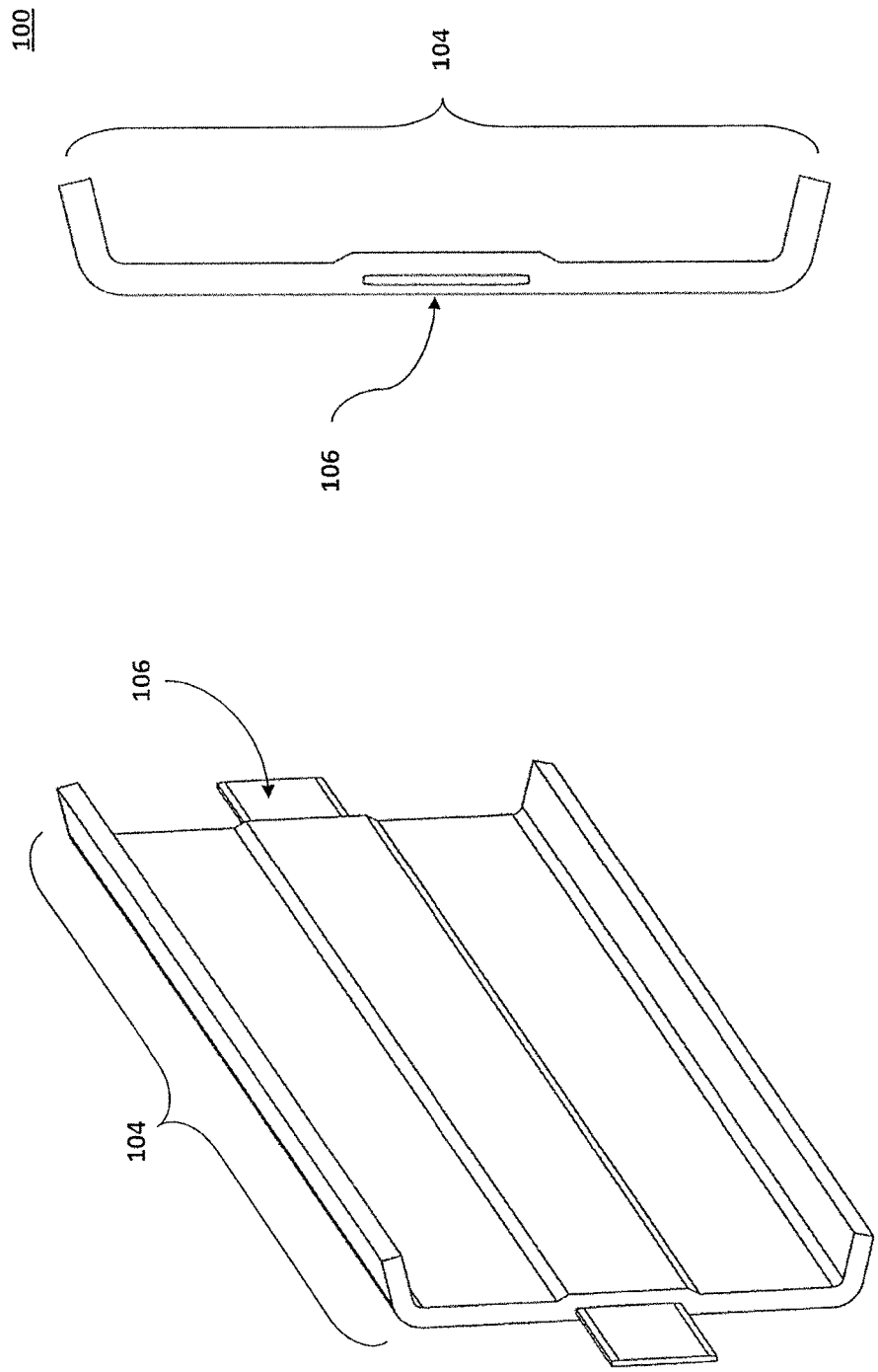

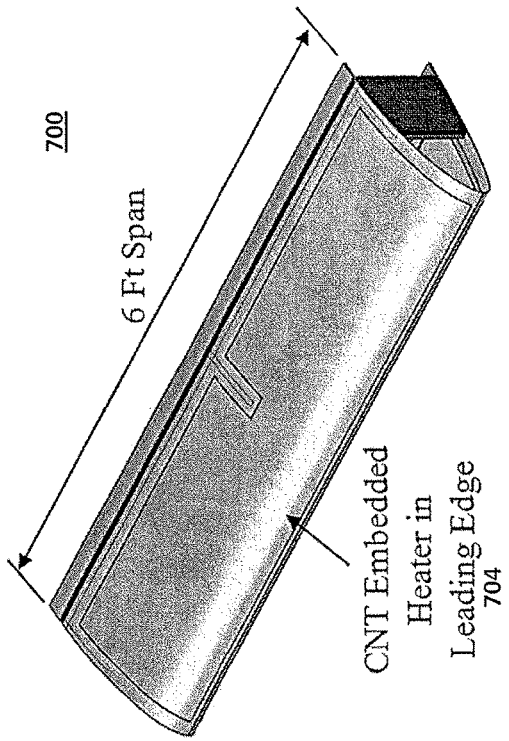
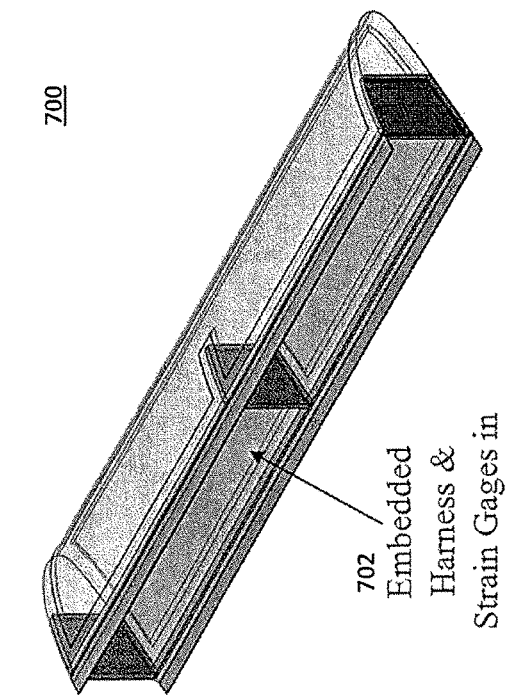
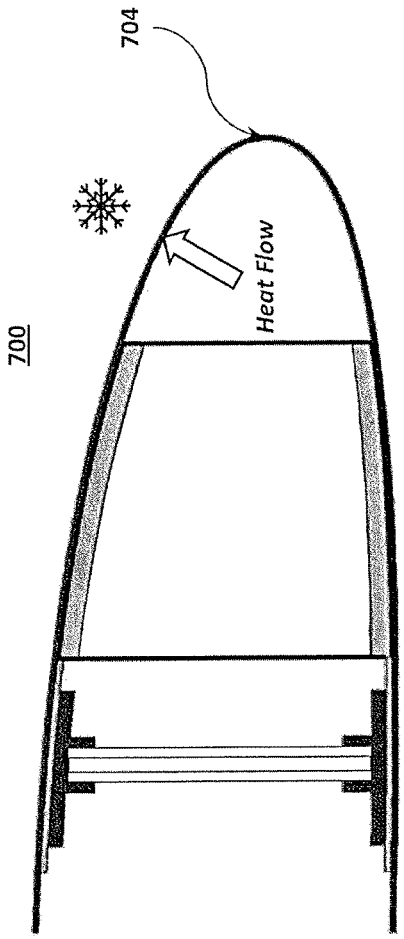
Fig. 7a — 702 Embedded Harness & Strain Gages in Spar
Fig. 7b — CNT Embedded Heater in Leading Edge 704; 6 Ft Span
Fig. 7c — 704; Heat Flow

| # | T300 CF | 120 GF | CF Veil | NiCVD on CF Veil | 22 AWG | | NiCVD on CF Veil | 120 GF |
|---|---|---|---|---|---|---|---|---|
| | # Carbon Plys | Glass under conductor | Conductor | NiCVD Pad under wire | Wire config | Solder | NiCVD pad over wire | Glass over conductor |
| 1 | 4 | 2 | 1 | 1 | None | | 0 | 1 |
| 2 | 4 | 2 | 1 | 0 | None | | 0 | 1 |
| 3 | 4 | 1 | 1 | 1 | None | | 0 | 1 |
| 4 | 4 | 2 | 1 | 0 | 3 strand | X | 1 | 1 |
| 5 | 4 | 2 | 1 | 1 | 3 strand | X | 1 | 1 |
| 6 | 4 | 2 | 1 | 1 | Frayed | X | 1 | 1 |
| 7 | 4 | 2 | 1 | 0 | Frayed | X | 1 | 1 |
| 8 | 4 | 2 | 1 | 0 | Frayed | | 0 | 1 |
| 9 | 4 | 2 | 1 | 0 | Solid | X | 0 | 1 |
| 10 | 4 | 2 | 1 | 1 | Solid | | 1 | 1 |
| 11 | 4 | 2 | 3 | 0 | Frayed | | 1 | 1 |

Fig. 9

CROSS SECTION OF FLAT EMBEDDED HEATER TEST PANEL

MULTI-FUNCTIONAL COMPOSITE STRUCTURES

This application is a non-provisional of U.S. patent application No. 62/007,373, filed Jun. 3, 2014, the contents of both incorporated herein by reference

TECHNICAL FIELD

The present invention relates generally to wiring and wire harnesses. More particularly, the invention relates to apparatus and method for an aircraft conductor sandwich assembly embedded to an aircraft structural member.

BACKGROUND INFORMATION

Modern air vehicles contain many miles of electrical power and signal wiring. Wiring is costly to install, heavy, and vulnerable to damage from service (i.e., incorrectly routed near hot equipment and/or bundled together with other incompatible wire types such as soft wire laying adjacent to hard wire, etc.) and maintenance. Moreover, all wire deteriorates in service due to environmental factors such as: extreme heat and cold temperature swings, humidity, salt damage associated with marine environments, contamination by aircraft fluids (i.e., fuel, oil, hydraulic fluid, de-icing fluid, cleaning chemicals, toilet residue, galley spillage, etc.), as well as in-flight vibration causing chafing of wires rubbing against other wires or the structure of the aircraft.

The above-described electrical power and signal wiring are typically provided through a wire harness (a.k.a. cable harness), which typically bundles a collection of cables and/or wires that transmit informational signals ("signals") or operating currents ("power") from one point to another. These wires and/or cables are often bound together to form a harness using, for example, clamps, cable ties, cable lacing, sleeves, electrical tape, conduit, a weave of extruded string, or a combination thereof. On most aircraft, wire bundles contain many different wires with several different types of insulation. Typically, wire bundles are composed of AC power cables, DC power cables, signal (circuit controlling) wires, and circuit ground wires. Also, there are bundles that carry power from different power sources (busses). These conditions make it extremely difficult to protect any circuit in such a bundle, where an insulation failure could result in an electrical problem that has multiple power sources and current paths to feed it. A wide variety of problems arise including shorting, arcing, or some other type of damage to a bundle with this mix of wires.

In addition to air vehicles (e.g., spacecraft, and aircraft), wire harnesses are used in automobiles, motorcycles, trains, ships, and boats. Indeed, vehicles typically contain many masses of wires that may stretch over several miles if fully extended. Binding the wires and cables into harnesses better secures them against the adverse effects of vibrations, abrasions, and moisture. By constricting the wires into a non-flexing or semi-flexing bundle, usage of space is also increased, and the risk of a short circuit is greatly decreased. Similarly, installation time is decreased since an installer must install only a single harness (as opposed to multiple loose wires). In certain situations, the wires may be further bound into a flame-retardant sleeve that lowers the risk of electrical fires.

While the wire harnesses provide several advantages over loose wires and cables, wire harnesses still suffer from the above deficiencies. For example, in aviation, weight is a crucial factor and, as new military and civilian aircraft systems are developed, wire harnesses account for increasingly larger mass fractions of the aircraft's total weight. Similarly, for new military and civilian aircraft platforms, there is a continuous drive to simultaneously improve performance while reducing costs. Another drawback of traditionally bound wire harnesses is the clutter and space inevitably occupied by the wire bundles. Furthermore, current aircraft development emphasizes electrical systems that enhance the overall performance of the platform. This includes state-of-the-art systems such as fly by wire, electro-hydraulic actuators, distributed sensor systems and high power payloads. With the increased demand on electrical components have come increasingly complex installations and maintenance. Current efforts to reduce the weight and complexity of these systems center on moving from cables to high-speed serial architectures, switching from hydraulic to electrical systems, and distributed architectures. Not surprisingly, these efforts require an increased emphasis on harness materials and design while significantly reducing harness mass fraction; a task that cannot be accomplished with traditional wire harnesses. Finally, traditional wire harnessing techniques typically require specific components to secure harnessing (e.g., wires, and other conductors) along the length of a structure (e.g., fuselage, wing, etc.) and other features, such as holes or conduits, that facilitate passing the harnessing through a structure, such as ribs and bulkheads.

Thus, what is needed is an economical, lightweight wire harness capable of being embedded within or integrated with the structure and/or body panel of a vehicle. Embedment of these conductor systems in composite structure during manufacture may significantly reduce cost, weight, improve reliability, and most significantly, reducing the factor of safety (i.e., systems such as fly by wire ("FBW") aircraft would benefit greatly by allowing for improved redundancy and increased safety).

As will be discussed in greater detail below, such embedded wire harnesses may be facilitated using carbon nanotubes ("CNT") material, carbon nano-filaments ("CNF") material, fiber-reinforced plastic ("FRP"), fiber metal laminate ("FML"), metal deposited polyester nonwoven material (e.g., Nickel/Copper Polyester Nonwoven, and nickel chemical vapor deposition ("NiCVD") coated fibers), or a combination thereof. For example, one or more conductors (e.g., CNT, CNF, NiCVD, etc.) may be sandwiched between two or more insulating layers of material such that the conductor is electrically isolated and structural loads can be passed through the conductor sandwich assembly ("CSA"). The CSA may be incorporated either into or onto a composite structure without detrimental effect to the electrical and structural properties of the incorporated system.

STATEMENT OF GOVERNMENT INTEREST

This invention was made with government support under Contract Number: FA8650-11-M-1140 awarded by United States Air Force. The government has certain rights in the invention.

SUMMARY

The present disclosure endeavors to provide an embedded conductor system and/or wire harness enabled for use in aviation and other vehicles.

According to a first aspect of the present invention, a multi-functional composite structure comprises: a core; a plurality of structural composite fiber layers; a matrix material; a connector configured to interface with one or more electrical devices; a composite conductor assembly, the composite conductor assembly having one or more conductors disposed between two or more insulating layers, wherein a first portion of the composite conductor assembly is embedded between a first set of two layers of said plurality of structural composite fiber layers, wherein structural loads are passed through said composite conductor assembly, wherein the two or more insulating layers electrically isolate the one or more conductors from said plurality of structural composite fiber layers, wherein a second portion of the composite conductor assembly egresses from the multi-functional composite structure by traversing at least one of the plurality of structural composite fiber layers while maintaining electrical isolation between the composite conductor assembly's one or more conductors and the plurality of structural composite fiber layers.

According to a second aspect of the present invention, a method for embedding a composite conductor assembly to an aircraft's load-bearing composite structure comprises: forming a composite conductor assembly having (i) one or more conductors disposed between two sheets of insulating layers, and (ii) an adhesive resin bonding the one or more conductors and the two sheets of insulating layers such that the one or more conductors are electrically isolated from each other and from any aircraft structural member, and such that structural loads can be passed through said conductor sandwich assembly; and bonding the composite conductor assembly to the aircraft's load-bearing composite structure, the load-bearing composite structure having (i) a core, (ii) a plurality of structural composite fiber layers, and (iii) a matrix material, wherein a first portion of the composite conductor assembly is embedded between two of said plurality of structural composite fiber layers, wherein the two or more insulating layers electrically isolate the one or more conductors from said load-bearing composite structure, wherein a second portion of the composite conductor assembly egresses from the multi-functional composite structure by traversing at least one of the plurality of structural composite fiber layers while maintaining electrical isolation between the composite conductor assembly's one or more conductors and the load-bearing composite structure.

According to a third aspect of the present invention, a load-bearing composite structure for use in a vehicle, the load-bearing composite structure comprises: a core; a plurality of structural composite fiber layers, including a first, a second, and a third structural composite fiber layer; a matrix material; a connector configured to interface with one or more electrical devices, wherein the connector is positioned at the surface of the third structural composite fiber layer and operatively coupled to the composite conductor assembly; a composite conductor assembly, the composite conductor assembly having one or more conductors disposed between two or more insulating layers, wherein structural loads are passed through said composite conductor assembly, wherein the two or more insulating layers electrically isolate the one or more conductors from said plurality of structural composite fiber layers, and wherein the composite conductor assembly is stepped through the plurality of structural composite fiber layers such that (i) a first portion of the composite conductor assembly is embedded between the first and second structural composite fiber layers, (ii) a second portion of the composite conductor assembly is embedded between the second and third structural composite fiber layers, and (iii) a third portion of the composite conductor assembly traverses the third structural composite fiber layer to egresses from the multi-functional composite structure while maintaining electrical isolation between the composite conductor assembly's one or more conductors and the plurality of structural composite fiber layers.

In certain aspects the at least one of said one or more conductors may comprise a carbon nanotube material, a nickel chemical vapor deposition material, and/or a fiber metal laminate material. In certain aspects the composite conductor assembly is stepped through the plurality of structural composite fiber layers. For example, the composite conductor assembly is stepped through the plurality of structural composite fiber layers to egress the multi-functional composite structure. More specifically, the composite conductor assembly is stepped through each of the plurality of structural composite fiber layers. In certain aspects the composite conductor assembly may comprise (i) a third portion embedded between a second set of two layers of said plurality of structural composite fiber layers, said second set being different from said first set; and (ii) a fourth portion embedded between a third set of two layers of said plurality of structural composite fiber layers, said third set being different from said first and second sets.

BRIEF DESCRIPTION OF THE DRAWINGS

These and other advantages of the present invention will be readily understood with reference to the following specifications and attached drawings wherein:

FIG. 1A illustrates an embedded CSA co-cured within a representative structure;

FIGS. 7a through 7d illustrate an example wing leading edge with embedded electronics;

FIG. 9 illustrates a chart of example ingress/egress layup configurations; and

DETAILED DESCRIPTION OF THE PREFERRED EMBODIMENTS

Figure 1B:
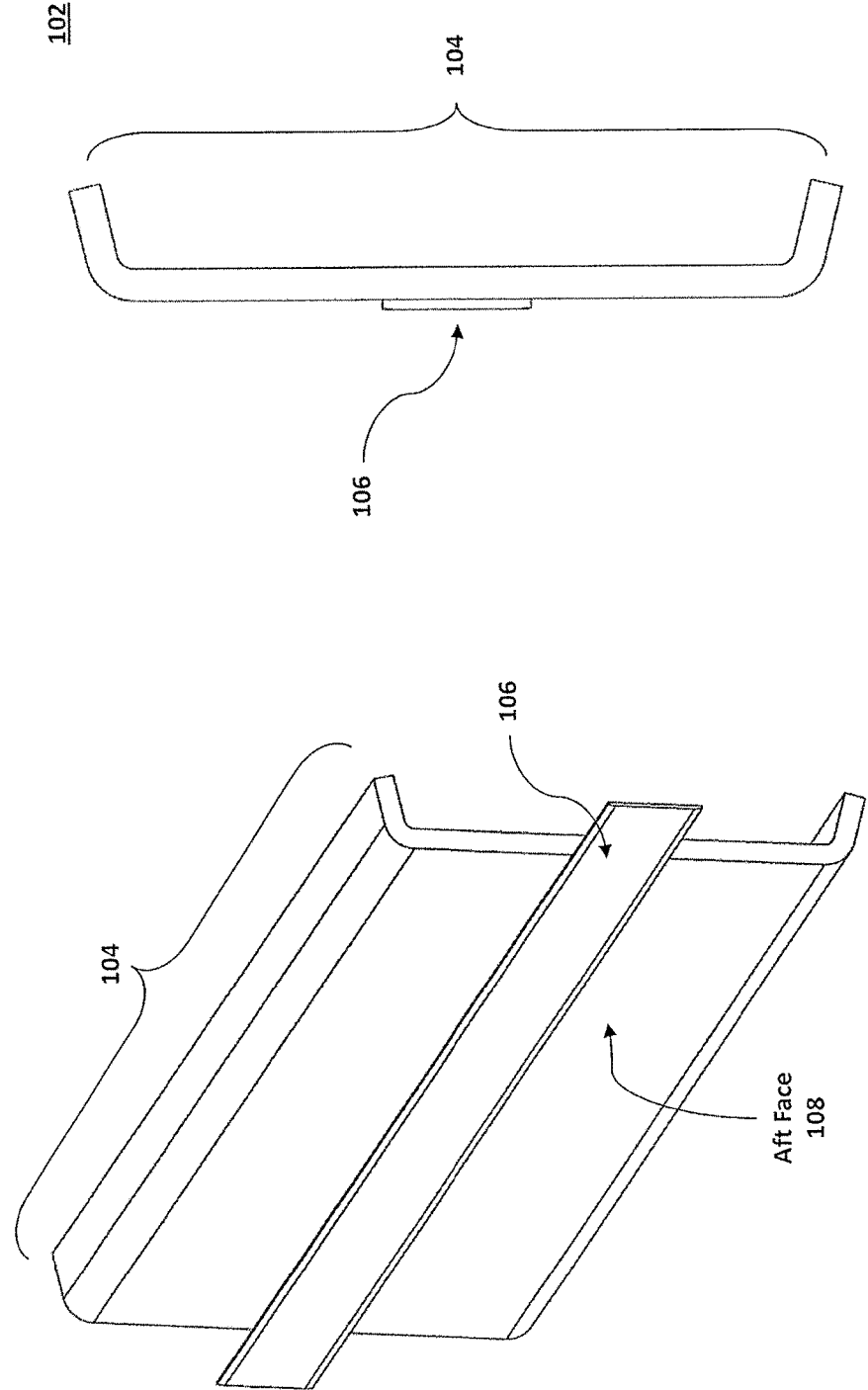
FIG. 1B illustrates an embedded CSA co-bonded within a representative structure.

Preferred embodiments of the present invention will be described hereinbelow with reference to the accompanying drawings. In the following description, certain well-known functions or constructions are not described in detail since they would obscure the invention in unnecessary detail. For this application the following terms and definitions shall apply:

The term "conductor sandwich assembly" ("CSA") as used herein describes the structure formed when one or more conductors (e.g., carbon, metal, NiCVD, etc.) are sandwiched between insulating layers of material such that the conductor is electrically isolated and structural loads (i.e., shear, tension, compression, bending, and combined loads) can be passed therethrough. As discussed herein, a CSA may be configured to carry power and/or signals via the one or more conductor traces. A CSA may further include one or more shielding layers to reduce, or eliminate, interference to any signal carrying conductors or by any power carrying conductors. A CSA may be embedded deep within a structure (e.g., a composite structure) or embedded at, or adhered to, the surface of a structure.

The term "composite material" as used herein, refers to a material comprising an additive material and a matrix material. For example, a composite material may comprise a fibrous additive material (e.g., fiberglass, glass fiber ("GF"), carbon fiber ("CF"), aramid/para-aramid synthetic fibers, FML, etc.) and a matrix material (e.g., epoxies, polyimides, aluminum, titanium, and alumina, including, without limitation, plastic resin, polyester resin, polycarbonate resin, casting resin, polymer resin, thermoplastic, acrylic resin, chemical resin, and dry resin). Further, composite materials may comprise specific fibers embedded in the matrix material, while hybrid composite materials may be achieved via the addition of some complementary materials (e.g., two or more fiber materials) to the basic fiber/epoxy matrix.

The term "composite laminates" as used herein, refers to a type of composite material assembled from layers (i.e., a "ply") of additive material and a matrix material. For example, layers of additive material, such as fibrous composite materials, may be joined to provide desired engineering properties, including inplane stiffness, bending stiffness, strength, and coefficient of thermal expansion. Layers of different materials may be used, resulting in a hybrid laminate. The individual layers may be orthotropic (i.e., principal properties in orthogonal directions) or transversely isotropic (i.e., isotropic properties in the transverse plane) with the laminate then exhibiting anisotropic (i.e., variable direction of principal properties), orthotropic, or quasi-isotropic properties. Quasi-isotropic laminates exhibit isotropic (i.e., independent of direction) inplane response but are not restricted to isotropic out-of-plane (bending) response. Depending upon the stacking sequence of the individual layers, the laminate may exhibit coupling between inplane and out-of-plane response. An example of bending-stretching coupling is the presence of curvature developing as a result of inplane loading.

The term "composite structure" as used herein, refers to structures, or components, fabricated, at least in part, using a composite material, including, without limitation, composite laminates.

As discussed above, existing traditionally bound wire harnesses suffer from a number of drawbacks in that they can be, for example, heavy, voluminous, and subject to shorts, especially in connection with movable structures. Further, traditionally bound wire harnesses are also limited in that they cannot be used in certain locations due to size or weight constraints. These problems and risks, however, are greatly reduced by implementing embedded conductor technology (e.g., for power and/or signals) in lieu of traditionally bound wire harnesses. Accordingly, an object of the present disclosure to implement a lightweight, streamlined, embedded conductor harness technology to be used in lieu of, or in conjunction with, traditionally bound wire harnesses.

Indeed, embedded conductor technology, which may be used to carry power and/or signals, offers a number of advantages over traditional harnessing. First, embedded conductor technology increases aircraft internal volume by reducing the space typically reserved, or required, for traditional harnessing. Thus, embedded conductor technology is particularly useful where space is limited because it does not require space consuming wire bundles, conduit, tie downs, and other hardware associated with traditional harness runs.

Secondly, embedded conductor technology increases durability as the embedded conductors are less likely to be impacted (e.g., nicked, rubbed, damaged, etc.) in operation and/or during maintenance. That is, reliability and durability is improved because the conductors are retained and secured within the vehicle's structure, whereby the vehicle's structure functions to protect the conductors with minimal influence to the structure. In certain circumstances, the embedded conductor technology may further strengthen, or increase the rigidity of, the structure.

Thirdly, embedded conductor technology can reduce weight by eliminating the need for conduits, attaching structure, and reinforcing weight needed for standard methods of securing cabling. Conductive composite materials also offer a weight benefit as compared to traditional metals and are typically more compatible with standard composite materials and resin systems in terms of thermal compatibility and galvanic properties, while providing anti-corrosive properties. Moreover, further weight reduction can be realized if previously non-structural elements, such as insulation, are turned into structural (load bearing) elements. Fourthly, embedded conductor technology can reduce cost by lowering part count, improving assembly time, and reducing maintenance. The part count is reduced because traditional conduit, tie downs, and other such hardware are no longer required throughout the aircraft. Moreover, component may be quickly connected via connectors at ingress/egress locations.

Finally, wide-area power resulting from dispersing the conductors across a surface increases survivability and reliability of the vehicle when a single point failure occurs. In other words, distributing the power and/or signal conductors over a large area ("wide-area") is more robust in terms of damage survivability because there need not be a single conductor to cut and any damage would be limited to specific conductors, not an entire bundle (as can be the case with traditional wiring harnesses).

Similarly, wide-area power facilitates the use of a multitude of components and sensors throughout the vehicle, in addition to motors, by providing power and signal capability where such functionality was not previously possible. Indeed, embedded conductor technology increases the potential for the introduction of health monitoring and distributed sensing capabilities. For example, embedded conductor technology may facilitate functionalities such as structural health monitoring (e.g., embedded sensors), shielding (e.g., electromagnetic interference ("EMI") shielding), anti-icing, and de-icing. Indeed, monitoring and sensing capabilities/infrastructure (e.g., sensors and associated wiring) may be laid up as part of the composite structure (e.g., embedded during the manufacturing, co-cured or co-bonded) fabricated process. Thus, embedded conductor technology may be employed to provide resistance readings as a data feed input to certain systems.

Historically, health monitoring and distributed sensing capabilities were inadequate due to the limitations and bulk of traditional wire harnesses. The embedded conductor technology would be pertinent to other technologies. The use of embedded conductor technology facilitates improved sensor technology by eliminating the space constraint associated with traditional harnesses. Thus, embedded sensor technologies may be applied to a broad spectrum of applications in vehicle control (such as Fly-By-Feel and other unmanned aerial vehicles ("UAV") and systems), assessing mission performance, and cost benefits.

Embedded conductor technology can also provide a thermal conduction path to reject unwanted heat through the structure, which would in turn reduce drag and weight as compared to traditional heat rejection methods. In fact, the vehicular structure may be designed to provide low thermal resistance path for heat rejection. For example, when servos are joined to, or embedded in, an aerial vehicle's wing's composite structure, undesired heat through the structure may be rejected, as opposed to traditional methods that absorb the heat, thereby reducing drag and weight.

Furthermore, as more composite aerial vehicles are developed, a greater need exists for a de-icing and/or anti-icing solution that does not rely on engine bleed air (e.g., warm/hot air from the engines). Epoxy and Bis-Maleimide ("BMI") pre-impregnated resin systems ("pre-preg", i.e., composite fibers having uncured matrix material already present) are the two more common composite matrices used in aircraft structures; however, neither of these is capable of withstanding the temperatures typically associated with engine bleed air (typical values can be 200-250° C. and 275 kPa (40 pounds per square inch ("PSI")), forcing metal components to be used where bleed air is used. As expected, such metal components increase both cost and weight of the vehicle. However, as explained below, conductive composite materials may function as embedded heaters to perform de-icing and/or anti-icing functions without requiring such metal components, while also keeping the temperature of the composite material within operational limits. Thus, embedded conductors may carry high power to the motors while simultaneously heating the surface of the vehicle (e.g., a leading edge of a wing) for de-icing and/or anti-icing.

In view of the above, an embodiment of the present application teaches an economical, lightweight conductor/wire harness and wire harness system capable of being embedded within the structure and/or body panel of a vehicle. Such embedded conductor technology may be accomplished by sandwiching electrical conductors between two or more insulating layers of material such that the one or more electrically isolated conductors form a CSA. The CSA may be embedded within the structure itself (e.g., during the fabrication of a composite structure) or embedded on (or adhered to) the surface of a pre-fabricated structure. Once assembled, structural loads may then be passed through the CSA.

Such embedded conductor systems may be employed in areas where traditional wiring is prone to damage or where traditional wires cannot be easily run. For example, aircraft wheel wells and wing trailing edges are places where traditional wiring may be found hanging from structures and can be damaged by moving parts such as gas struts. Other appropriate areas in which embedded conductor systems may be employed include areas whereby cabling would typically be subject to damage or otherwise impractical, such as: rear spars adjacent to flaps, ailerons, and spoilers; long runs of cabling with several connection nodes such along wing (spars, stringers) or fuselage (longerons, keels) structures; electrical systems which required distributed networks of wiring such as for structural health monitoring, temperature monitoring; compartment heaters such as for avionics or wall/floor heating of passenger compartments; ice protection systems such as de-icing and/or anti-icing systems; lightweight heater pads such as hot plates; and automobile heating systems. In addition, the embedded conductor systems further facilitate all electric aircraft, thereby doing away with hydraulic actuators and replacing them with electro-mechanical actuators.

A CSA may further comprise one or more shielding layers to reduce, or eliminate, interference to any signal carrying conductors. The shielding layers may also act to reduce any interference created by power carrying conductors. Thus, in addition to carrying power and/or data signals, embedded conductors within a composite laminate structure may provide EMI shielding and resistive heating functionalities. EMI shielding may be provided, for example, to shield components from external frequencies. To that end, dielectric materials may be incorporated within a traditional composite laminate structure to provide a conductive barrier between the structural materials and conductive materials (e.g., those conductive for power/signal transmission). For example, tests illustrated that test coupons with three sheets (i.e., three plys) of CNT improved shielding from the baseline coupons by approximately 10 dbm, whereby a wingtip EMI article illustrated 10 dbm attenuation from the baseline.

Indeed, embedded conductors and insulating layer materials may be compatible with existing structures (e.g., a composite structure) to provide a specific functionality. For electrical purposes, power and signal cabling, EMI shielding, resistive heating, capacitance and impedance matched conductors can be embedded within laminate. The addition of this capability provides additional structural benefits such as structural strength, stiffness, resistance to moisture ingress, impact resistance, and durability depending on the materials selected and layup configuration of components. For example, mechanical impact tests on panels showed that CNT sheets improve damage tolerance over the baseline to varying levels depending on the location within the layup.

As disclosed herein, a CSA, with or without shielding layers, may be incorporated into and/or onto a composite structure without negatively impacting the electrical and structural properties of the incorporated system. In such situations, the conductive and dielectric materials may further provide structural functionality to the composite structure. To facilitate interconnection with other components or systems, embedded connectors (e.g., an electrical connector) may be provided at the surface of the composite structure to interface with traditional power/signal transmission devices. Thus, the embedded connectors, which are electronically coupled to the embedded conductor(s), may be configured to ingress/egress in/out of the composite structure's composite material plys while maintaining isolation between the embedded connectors and composite structure. Indeed, using embedded conductor technology, multi-functional vehicle sections/components (e.g., multi-functional wings, such as those illustrated in FIGS. 7a-7c) may be provided that incorporates both embedded data processing and structurally embedded power systems.

Embeddable Conductors.

A number of materials may be used as the suitable embedded conductors. Such materials may include, for example, carbon based conductors (e.g., CNT material, CNF material, NiCVD carbon nonwoven materials), metallic conductors (e.g., copper, gold, silver, metal deposited polyester nonwoven material), other materials (e.g., Nickel/Copper Polyester Nonwoven), or a combination thereof. CNT materials and NiCVD material are generally discussed herein as the preferred conductors; however alternative conductors, including metallic conductors, may be similarly used and are contemplated. In certain aspects, when metallic conductors are employed, aluminum would be a preferable metallic conductor.

Over the last decade, CNT material has become an increasingly viable material for structural and electrical uses. Generally, CNTs are allotropes of carbon with a cylindrical nanostructure and are an ideal conductor for an embedded signal application. Another possible conductor may be CNF. CNFs (a.k.a vapor grown carbon fibers ("VGCF"s) or vapor grown carbon nanofibers ("VGC-NF"s)) are nanostructures with graphene layers arranged as stacked cones, cups, or plates, whereas CNTs are carbon nanofibers with graphene layers wrapped into cylinders. Generally speaking, CNTs and CNFs are superior to copper in terms of embedded conductor and harness application. First of all, copper has a higher coefficient of thermal expansion ("CTE") than carbon (copper is ~16.6×10-6 m/m K, while carbon is ~2×10-6 m/mK), which causes a change in volume in response to a change in temperature, lower strength, and a higher modulus which inhibits its flexibility. Secondly, copper is also prone to strain hardening, which weakens the copper material over time. These factors combine to make copper highly susceptible to breakage and damage as an embedded harness. However, CNFs' and CNTs' CTE, low modulus, and high strength have the exact opposite effect, combining to handle large temperature swings and vibration, while deflecting with the structure. For these reasons, CNT and CNF materials are superior to copper for harness and wiring embedment. In addition, CNTs and CNFs can be folded and bent onto themselves without breakage, allowing them to be routed in the sharp corners and curves of composite structures. This property and their high strength enables CNF and CNT embedded harnesses to have tight bend radii when exiting connectors. For example, modern carbon conductor materials, such as Nanocomp's conductive CNT yarn and sheet media, exhibit a high strength, high conductivity, and low modulus compared to other traditional carbon materials. These features make them attractive for embedded harnessing applications. It is also estimated that there will be a cost and weight reduction by using embedded CNTs as the CNT material expectedly improves. In order to realize these reductions, development of conductor embedment that is structurally and electrically stable, while being lightweight, is essential.

In testing the usability of CNT conductor materials within a composite structure's resin layup, measurements were taken using 0.5- by 8-inch length strips ("coupons") of Nanocomp 15 gsm CNT sheet material impregnated with Patz Materials and Technology's PMT-F4 resin (a highly toughened epoxy resin system designed for vacuum bag, press and autoclave curing using standard layup procedures). The PMT-F4 resin can be impregnated into numerous reinforcements and imparts a medium/dry tack and compatible with standard 250° F. release materials and bagging procedures.

The resistance along the 8-inch length strips was measured using an Extech Instruments precision milliohm meter before layup and after layup cure to identify any variations within the CNT conductors. The resistance of each CNT conductor coupon was measured in the cured condition using several different conductive epoxies at the connector sites. The data calculated indicates that the resistance after curing is approximately double that of the resistance prior to curing, but the resistance variation between coupons was nominal, despite the epoxy selection.

While CNT results were promising, NiCVD materials were similarly investigated as an alternate conductor material. From a conductivity standpoint, the NiCVD is better as a power conductor due to higher specific conductivity (i.e., 866 S-cm$^2$/gm, versus CNT's 238 S-cm$^2$/gm). As with the CNT testing, the resistance along the 8-inch length of NiCVD material was measured using an Extech Instruments precision milliohm meter prior to layup and after layup cure to identify any variations within the NiCVD conductors. Again, the resistance of each NiCVD conductor coupon was measured in the cured condition using several different conductive epoxies at the connector sites. The NiCVD conductor coupon measured low resistance with no significant change after 250° F. cure.

In view of the tests, an advantage of the NiCVD material is the low resistance. Moreover, NiCVD material may be a suitable replacement for CNT material as an embedded conductor because of lower cost. NiCVD material is currently approximately 10-20 percent of the cost of comparable CNT material, depending on the electrical application. One ply of film adhesive (i.e., 3M AF163) was also found to work well with the nonwoven material and did not increase resistance. Basic electrical property relationships were determined for the CNT and NiCVD sheet conductor materials, whereby it was determined that NiCVD Nonwoven exhibited greatly reduced resistivity and resistance post-cure vis-à-vis CNT, while illustrating increased average conductivity and average specific conductivity. More specifically, the resistance of CNT was found to be about 4-7 times higher than NiCVD Nonwoven, while the conductivity of the NiCVD Nonwoven was found to be about 3.6 to 4.5 higher than CNT. However, in certain situations, CNT and NiCVD and be employed together to achieved a particular goal based on a desired resistance and conductivity.

To investigate the usability of NiCVD material as an embeddable conductor (e.g., in a CSA), an article was fabricated using NiCVD coated nonwoven sheet, 20 gsm and 45 gsm, and NiCVD coated zylon (i.e., poly(p-phenylene-2,6-benzobisoxazole)) in place of CNT sheet and yarn material. Yarn conductors provide a higher volumetric efficiency, however it can be more difficult to incorporate into a CSA without detrimental effect on the structure.

Figure 7D:
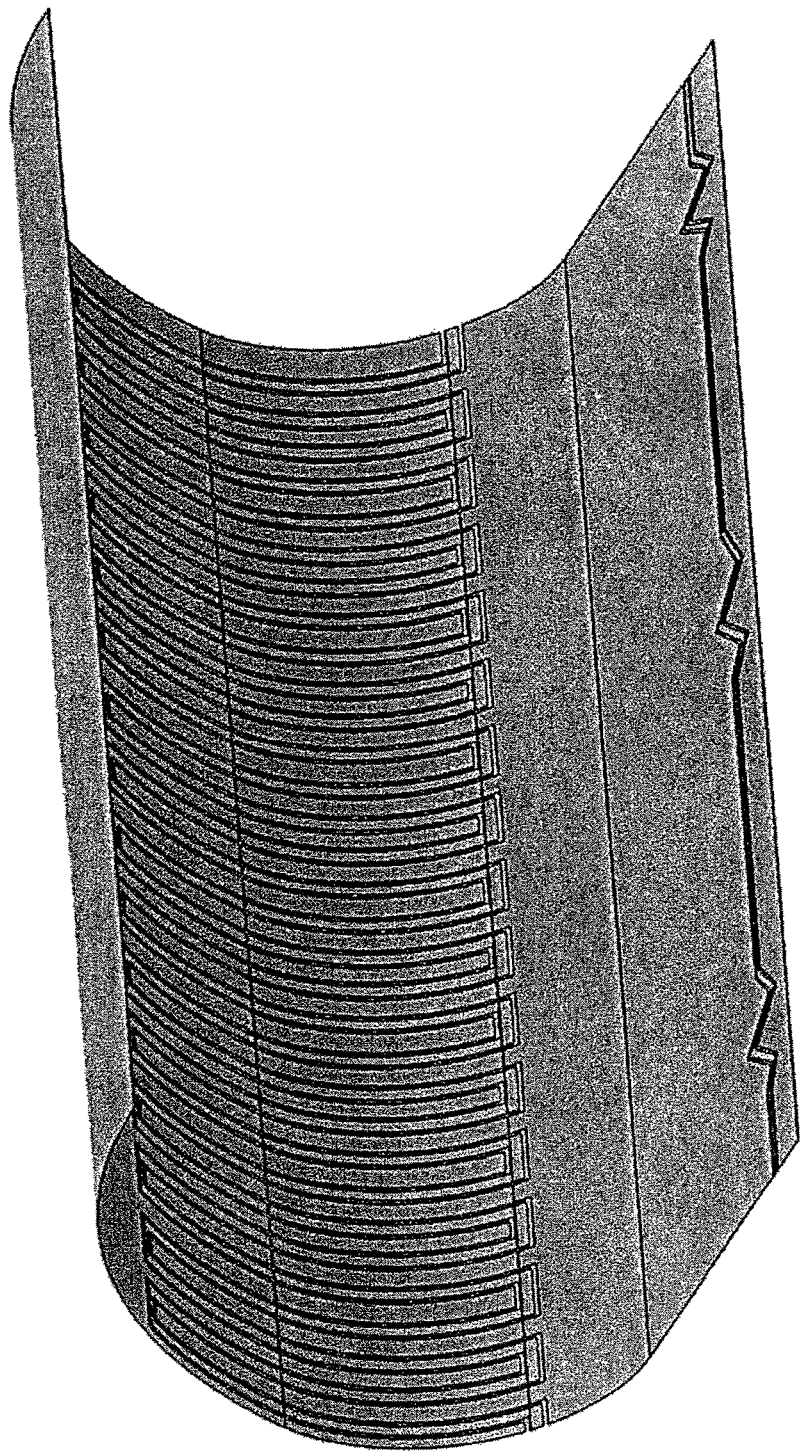

Further, a FML may also be used to facilitate multifunctional structures because an FML already includes both a conductor (i.e., metal bayer) and insulators (i.e., composite material layer). That is, FML typically comprises a laminate of several thin metal layers bonded with layers of composite material. For instance, a plurality of thin layers may be spaced between one insulating sheet, such as GF. The entire structure may share the same resin/epoxy matrix. Accordingly, the same electrical functionality discussed above with regard to CNT and NiCVD materials may be achieved using FML, The metal conductor material may be cut separately and laid up into the laminate as well. Alternatively, conductive sheet materials (CNT, Nickel Nonwovens, etc.) can be added to FML if the resistance of the parent material is not appropriate for the application. As illustrated in FIG. 7d, a gap may be created within a metallic layer between metal structures to form a circuit. This gap is filled by the insulating layer (e.g., GF) and epoxy/resin matrix.

Layup.

An embedded conductor harness layup schedule may comprise a combination of composite materials with conductor materials for conducting electricity (e.g., CNT yarns, CNT sheets, Nickel Non-Wovens, Non-Woven Carbon Fiber Veil, copper, aluminum mesh, etc.) therebetween and dielectric materials, which may also act as structural reinforcing (such as GF) or may not act as structural materials (e.g., PEKK polymer, Kapton). As disclosed herein, the embedding process itself is not conductor material specific, but instead may be adapted as CNT material, NiCVD material, and as other materials are matured or developed. The harness layup typically involves creating a harness within the structural laminate or on top of. The harness conductors may be layered in a fashion similar to a printed circuit board ("PCB"), wherein the conductor materials utilize a compatible resin system and are galvanically and thermally matched to the structural composite material.

For example, a harness layup may further employ tailored dielectric materials such as PEKK laminates or glass laminates with specific resin weight contents and/or resins with higher dielectric strengths. Similarly, a harness layup may tailor the separation of conductive layers via the dielectric layers to achieve specific electrical properties (e.g., impedance matching, capacitance, etc.). Further, to mitigate the risk of shorts resulting for water permeation, additional layers may be provided over the conductor(s) to act as a moisture barrier. For example, testing revealed that three suitable moisture barriers include, without limitation: (1) Single 120 glass fiber ply with additional resin; (2) Single glass fiber MTM45-1 GF0103 ply; and (3) Surfacing film/Single 120 glass fiber ply.

Power System Embedment.

An embedded power harness (e.g., a CSA enabled for carrying power) may be made of the one or more layers of non-impregnated conductor sheets (e.g., CNT, NiCVD, etc.), sandwiched (e.g., inserted between) between two or more layers of insulating film (e.g., fiberglass, typically 5 mil) and a film adhesive (e.g., aircraft film adhesive) with moisture barrier (e.g., FM300-2 MB, a moisture barrier film adhesive). The moisture barrier material may be, for example, a FM300-2 Moisture Barrier product available from Cytec, or laid up using a layer of PEKK (e.g., around 0.0014 inch thick) and adhesive resin film. Fiberglass layers provide insulation and stability while the film adhesive provides a moisture barrier and a bond to the surrounding carbon composite. The fiberglass can also provide up to 2400V of breakdown resistance (an attribute that is critical for the embedded system because power systems can often carry high voltages, and any breakage or fracture in the insulating film could lead to a hazardous short circuit). In certain embodiments, the insulating film may comprise an etched, bondable polytetrafluoroethylene ("PTFE") (e.g., Teflon, available from DuPont). For example, PTFE material may be etched with sodium ammonia or sodium naphthalene so as to chemically modify the surface for adhesion to various substrates using ordinary commercial-grade epoxies. When etched for bonding, PTFE may be glued to surfaces to produce a non-stick, low-coefficient-of-friction unit.

As discussed in greater detail below, a CSA may be laid up (e.g., co-bonded or co-cured) with a composite material or structure and, once cured, becomes part of the composite structure (e.g., a spar, wing, etc.). During embedment, the CSA (or even individual conductors) may be impregnated as part of the layup (e.g., impregnated during manufacturing of the composite structure, co-cured). Because the CSA is protected by the structure material, there is less opportunity for damage during operation and maintenance. In certain embodiments, depending on the threat of liquid for a particular application, one or more additional barriers may be added to protect against liquid intrusion. These barriers may be incorporated within the CSA or around the CSA during curing/embedment. In certain embodiments, the liquid epoxy used to fabricate the composite structure may also be used to bond the one or more carbon conductors and the one or more layers to form the CSA. In certain embodiments, such as when co-cured, one or more conductors may be placed directly in the composite material of the structure prior to curing such that they do not make unwanted contact with another conductor. This arrangement eliminates the need for insulating layers as the non-conductive composite material of the structure would isolate the conductors and prevent unwanted contact with other conductors.

Signal System Embedment.

Signal harnesses (e.g., a CSA enabled for carrying data signals, whether analog or digital) require higher levels of quality and complexity as compared to electrical power systems. For example, to prevent inaccurate or weak signals, most conductive signal systems require strict voltage control while utilizing very small currents, where it may be common to drive mega-ohm loads. For embedded signal conductors, individual conductors (e.g., CNT yarn or NiCVD yarn), shields (e.g., EMT shields), a fiberglass insulator and a moisture barrier may be used to form the CSA. With the assistance of an adhesive or resin, the CSA may then be applied as a laminate tape. This signal harness may also be laid up with the embedment material and ingresses/egresses similar to the power system embedment. Signal embedment benefits from the same protection as power system embedment while also gaining from the significant weight savings that CNTs offer for signal conductors and shields.

Power and Signal System Embedment Testing.

To verify the usability of the embedded power/signal harnesses, applicant Aurora Flight Sciences fabricated an aircraft spar based upon Aurora's Orion aircraft having embedded power and signal harnesses. The harness was co-bonded onto an aircraft spar cured on a male aluminum tool with 8 plys of carbon fiber material in the cap (i.e., the edge) and 4 full plys over two sections of a core material, which were cured with film adhesive on each side. Peel ply was applied to the tool side to provide a surface for bonding the harness in a second cure.

Three separate 6 foot harnesses were fabricated on the spar web and co-bonded through a 250° F. cure, including a high amperage harness, a lower amperage harness, and a signal harness. The high amperage harness, which was shielded, was fabricated using copper mesh boarded to a central harness, which contained the low power harness and the signal harness. The various conductors were configured to interface with PCB connectors at each end of the aircraft spar. Shielding was provided using Nanocomp 15 gsm, acid etched CNT sheets impregnated with Patz PMTF-4 resin film and constructed as two individual plys, which sandwiched the power and signal conductors. The low power conductors were fabricated from three plys of impregnated 40 gsm, 0.375-inch wide NiCVD strips from Conductive Composites. The signal wires were provided via 10 and 12 HighTex CNT yarns (two of each). 120 fiberglass pre-preg was used as insulating layers between the low power conductors and the shielding. The 120 fiberglass pre-preg was also used to isolate the entire harness from the carbon of the spar. Although preliminary tests illustrated that two plys of glass could provide sufficient isolation and conductively insulate the harness up to 1,000V, this appeared to be highly affected by the resin content and final porosity of the cured glass plys. Accordingly, three plys of glass were used as the base isolation between the harnesses and the spar to ensure adequate insulation. The conductors (i.e., traces) were fabricated in two ply sets. During the first set, low power trace 1, and signal traces 3 and 5 were laid up. After two plys of glass, the second ply set of low power trace 2 and signal traces 4 and 6 were laid up. This was done to provide a better isolation between adjacent traces and to reduce the chance of shorting between them. Glass plys were dropped approximately 0.25-inch from the end of each trace allowing a pad of the conductive material to be exposed to the bag side during cure which would later act as the interface to the PCB.

More specifically, the embedded test power/data signal harness layup was assembled as follows: film adhesive; 3 plys 90 degree 120 GF; CNT shield ply; 2 plys 90 degree 120 GF; 3 plys NiCVD (low power trace 1); 12 strand CNT yarn (signal 3); 10 strand CTN yarn (signal 5); 2 plys 90 degree 120 GF; 3 plys NiCVD (outer power trace); 12 strand CNT yarn (outer signal); 10 strand CNT yarn (inner mid signal); 2 plys 90 degree 120 GF; 2 plys NiCVD (inner power trace); 12 strand CNT yarn (outer mid signal); 10 strand CNT yarn (inner signal); 2 plys 90 degree 120 GF; CNT shield ply; and 2 plys 90 degree 7781 GF. Concurrently the large power harnesses were assembled on either side of the central harness. The embedded power harness layup for the copper power harnesses was as follows: film adhesive; 3 plys 90 degree 7781 GF; Copper mesh with attached leads; and 2 plys 90 degree 7781 GF. Additionally small NiCVD pads were added to the end of each CNT yarn to allow more area for connection to the PCB connectors. These pads were approximately 0.13- by 0.25-inch long.

The embedded power harness was subjected to two power transfer tests; one with 120 VAC at 20 A for a total of 2400 W transmitted and another with 28 VDC at 50 A for a total of 1400 W transmitted. The temperature rise in each test was 10° F. and 40° F. respectively. At 50 A of current, the 6 foot system was acceptably efficient and dissipated 160 W of power in the harness. As will be discussed below, this temperature increase may be used, or further manipulated, to facilitate de-icing and/or anti-icing functions.

The embedded central harness was subjected to testing of both the low power harness and signal harness. The low power harness was tested using 28 VDC at 0.5 A. The conductive NiCVD pathways did not display any hot spots or any significant heating above ambient temperatures (~5° F.). Non-detrimental heating (an increase of approximately 20° F.) at the connection site between the PCB and the embedded harness was detected, thus the Z-axis connectors used may be modified in future applications as a solid connection across the entirety of the area of the connection pad site. The low power harness was also tested at 0.75 A and 28 VDC where the temperature on the NiCVD pathways increased slightly (an increase of approximately 5° F.). The signal harness was tested with a 12.5 MHZ 50 percent duty cycle square wave with a 5 Vpp amplitude and a 25 MHZ, 5 Vpp sinusoid. In both cases the significant inline resistance led to an acceptably signal voltage division loss, but even with this loss the systems were still well within standard transfer ranges for 10BT Ethernet, CANBUS, and RS-485 Serial. There was no evidence of the non-linearity or being out of symmetry in signals. Thus, the testing indicated that the test harnesses were, in terms of performance, a suitable replacement for traditionally bound wires.

Ingress/Egress.

Ingress/egress of embedded harnesses requires particular care in order to protect both the embedded harness (e.g., the conductors) and the embedment composite material. Generally, ingress/egress points are a stress and wear point for damage to the harness and present a potential point for water, fuel, and foreign debris to enter the embedment composite material. To counter this problem, various methods have been devised utilizing materials such as stranded insulated wire, flex PCBs or methods that employ compliant interfaces to transfer power in the Z-axis (thru plane) only to PCBs, connection pads, or other traditional interfaces/connectors. Further, the materials (e.g., the conductors), may be stepped through structural layers or plys of the composite structure, while maintaining isolation between structural materials and conductive material. In other words, rather than vertically penetrating the various layers at a single point to egress/ingress the composite structure, thereby enabling moisture/debris to penetrate straight to the core, the conductor(s) may ingress/egress in a gradual (e.g., one layer at a time), laterally offset manner such that moisture/debris penetration is inhibited.

For example, for power systems, the conductor may exit the embedment composite material and lay on a nonconductive block. A threaded stud may be installed (e.g., wet-installed) into the conductor layup and acts as the mounting point for local harnessing. For signal harnesses, the conductor tape may exit the embedment material and be mounted to a PCB. This is a similar process to mounting inter-board ribbon connections and may be, for example, soldered or compressed to the PCB. At this point, any number of connectors can be used to interface to the embedded signal harness. Because the harness is covered by the structure, there is less opportunity for damage during operation and maintenance.

While certain of the Figures are generally described in the context of CNT conductors embedded in an aircraft, the teachings and principles of the present invention may be applied to other conductive materials and vehicles without departing from the spirit and scope of the invention. For example, other conductive materials include, without limitation, NiCVD materials, metallic materials, and other embeddable conductors known to those skilled in the art, while other vehicles include, without limitation, land craft and water craft. Therefore, the teachings herein should not be viewed as vehicle- or conductor-specific, but rather, may be similarly applied to embedment of other materials in various vehicles. For example, an ingress/egress approach was examined using 20 gsm NiCVD coated nonwoven carbon veil in place of conductive epoxy at ingress/egress locations on the CNT sheets. Resistance measurements indicated that the connection performs very well. Thus, the nonwoven material may be laid up with the CNT sheets during the impregnation process—a process that is generally easier to employ than conductive epoxy.

FIGS. 1A and 1B illustrate an embedded harness 106 (e.g., a CSA comprising one or more power and/or signal conductors) enabled for use in an aircraft (e.g., a UAV) flight control device (e.g., a servo—a device used to provide control of a desired operation through the use of feedback). A typical aircraft flight control system comprises multiple components, including, for example, flight control surfaces, the respective cockpit controls, connecting linkages, aircraft engine controls and the necessary operating mechanisms to control an aircraft's direction in flight. An embedded power and/or signal harness 106 can be used to electronically connect the various devices within a flight control system. In fact, an embedded harness 106 may be used in place of virtually any wire currently used in an aircraft that travels along a service which permits embedment or attachment.

The harness 106 may be embedded to the surface of a composite aircraft member, for example, embedded inside, or embedded on the surface of, the composite aircraft member. In certain embodiments, the harness 106 may embedded on the surface of a metal structure, provided the harness 106 can be adhered to the metal and that insulation has been placed between the conductors and/or any metallic structures such that they are electrically isolated.

As illustrated in FIGS. 1A and 1B, a harness 106 may be embedded (e.g., surface embedment, or deep (sub-surface) embedment within a composite structure) in the spar 104 (e.g., an aft spar) of, for example, an aircraft wing structure. In either surface embedment or deep embedment, the harness 106 may be either co-cured 100 (FIG. 1A, wherein the CSA is installed in the composite structure as the composite structure is built up and they are cured together) or co-bonded 102 (FIG. 1B, the CSA is bonded to a pre-fabricated structure, e.g., with a resin or other adhesive) with the composite structure. The harness 106 may be embedded along the neutral axis on the composite structure to minimize loads and reduce the effects of flexing. If the composite structure is rigid, or flexing is not a concern, the harness 106 may be installed at any point on the composite structure.

For embedment deep within composite structures (FIG. 1A), harness 106 may be impregnated and co-cured 100 within the composite structure to provide integrity with the surrounding structure and not act as a structural defect. The CSA should readily bond to the surrounding materials without creating voids or structural deficiencies. For embedment close to, or at, the surface of the composite structure (FIG. 1B), the harness 106 may not need to be impregnated within the composite structure but only within the layers of protective material surrounding conductors, which may be co-bonded 102 to the composite structure in a secondary operation (e.g., with a resin or adhesive). The ability to co-bond a harness 106 to a structure in a secondary operation may enable retro-fitting of existing vehicles and aircraft with embedded conductor technology. This would be particularly useful in instances where additional sensors may be desirable but were previously difficult to execute due to traditional wiring techniques. For example, a multi-conductor CSA harness may be manufactured as a combination of conductors, insulating film layers, and film adhesive and delivered in a form ready to be installed into a composite layup, and co-cured with said layup. Similarly, the multi-conductor CSA may also be enabled for installation on a traditional metallic structure, provided the multi-conductor CSA is insulated such that no electrical contact exists between the conductors and the metallic surface.

Although they are equally electrically conductive, co-cured 100 and co-bonded 102 configurations each have certain advantages. For example, co-cured 100 embedment is typically more durable because the harness 106 is deep within the composite structure material and thus the CNT is protected by the composite structure material; however, co-bonded 102 embedment is superior with respect to ingress/egress because the CNT harness is embedded at the surface and not deep within the composite structure, therefore providing easy access to surface connections without potentially weakening the composite structure's integrity. Similarly, co-bonded 102 embedment is more easily manufactured because the harness 106 may be simply applied to a surface of a structure in a secondary operation and does not require the simultaneous fabrication of the composite structure and the embedded harness 106. However, co-cured 100 embedment eliminates excess weight because it does not require additional protective/insulation layers or adhesives that are typically used to adhere and protect co-bonded 102 harnesses 106. In view of the above benefits attributed to each embedment type, a designer ought to weigh the factors and determine which would be more applicable to his or her particular project. For example, an aircraft developed for UAV use may require additional durability while eliminating weight and may therefore prefer co-cured 100 embedment. Regardless of the embedment type, the harness 106 may run along the length of the spar 104 (or other component) until reaching, for example, the flight control servo location where the harness 106 would egress to provide the necessary power and signal input to the servo.

Figure 1C:
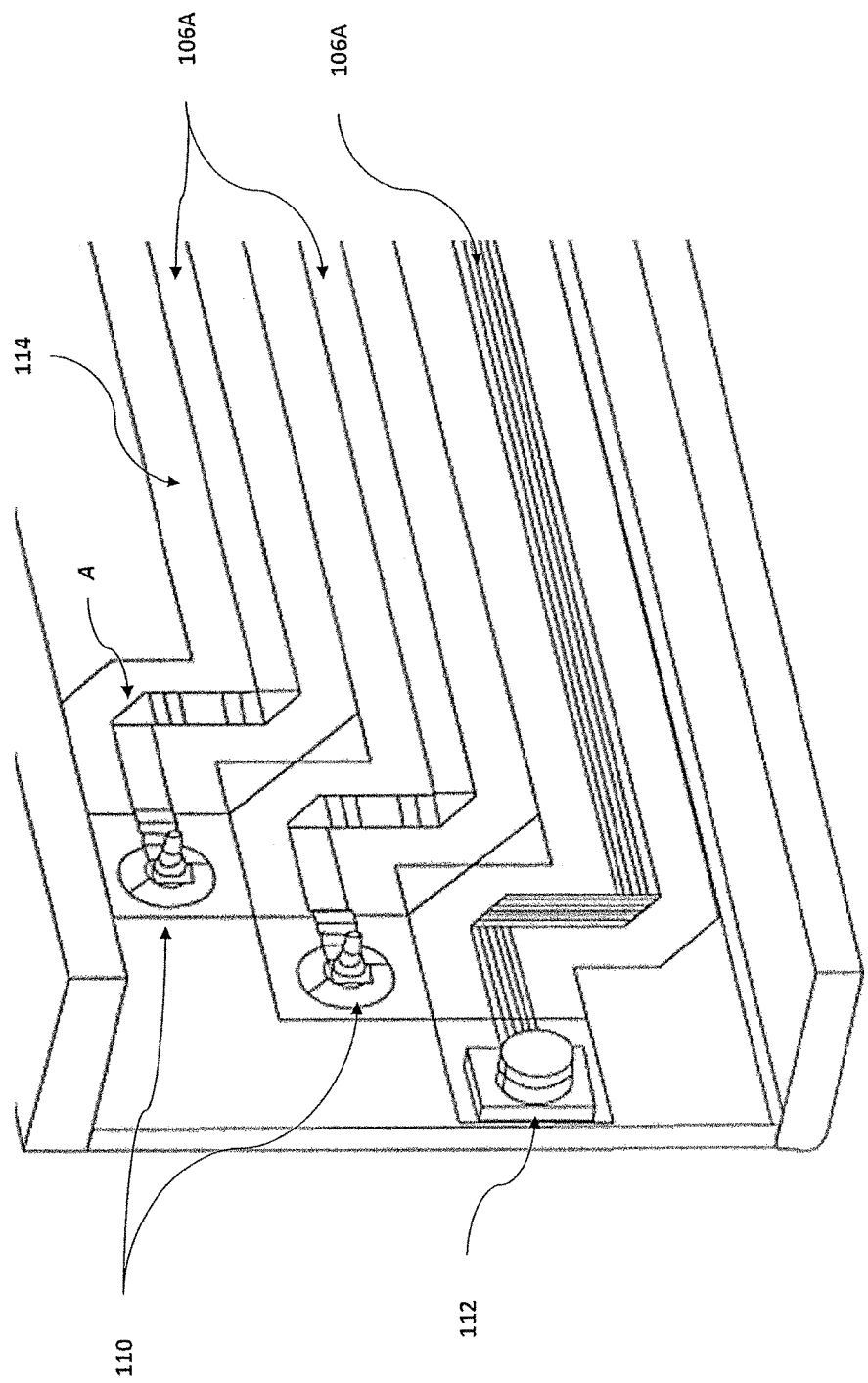
FIG. 1C illustrates an embedded power and signal harness (e.g., CSA) co-bonded with a spar.

FIG. 1C illustrates an embedment of an example CSA having both power and signal conductors in a long endurance aircraft wing spar 104 using CNT conductors 106. As seen in the Figure, power conductor 106A and signal conductor 106B CSAs are co-bonded 102 to the surface of spar 104 in the form of a laminate tape 114 (or beneath such a tape) and have ingress/egress connection points for both the power connections 110 and the signal connections 112. A number of connector types are possible, including, for example, 8P8C connectors (a.k.a eight positions, eight conductors), D-subminiature connectors, USB connectors, serial connectors, parallel connectors, power connectors, radio frequency connectors, DC connectors, registered jack connectors (e.g., RJ-XX), etc. To prevent electrical failures and/or malfunctions, regardless of the connection type used, the connector should also be non-corrosive and not paired with another material that may lead to corrosion. For example, a problem discovered by a Kelly AFB engineer trained in corrosion control was the corrosion of tin-plated electrical connector pins when mated with gold-plated sockets used in the F-16 fighter. At point A, FIG. 1C depicts examples where CNT conductors have been folded and bent onto themselves without breakage, allowing them to be routed into the sharp corners and curves of both composite and non-composite structures. This feature of CNT conductors makes them an ideal conductor for small spaces with sharp bends and turns.

Figure 2A:
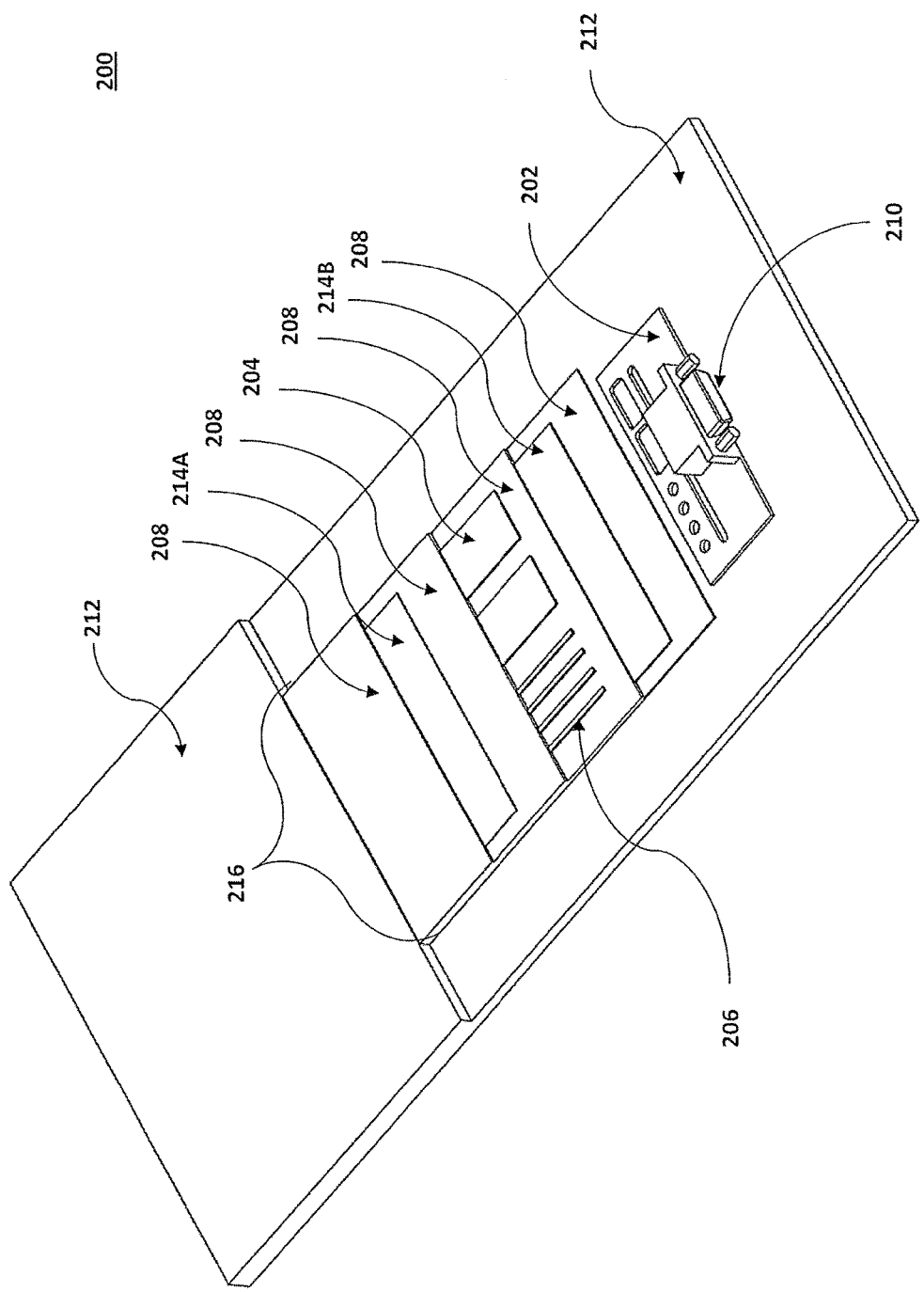
FIG. 2A illustrates an embedded CSA with printed circuit board connector at ingress/egress points.

FIG. 2A illustrates a composite structure 212 with an embedded CSA 216 having both sheet-shaped power 204 and yarn signal 206 conductors coupled with a PCB 202 for ingress/egress of the composite structure 212. As seen in the figures, the CSA 216 may be fabricated from multiple layers of CNT sheet 204 and yarn 206 sandwiched between layers of a polymer insulator 208 (e.g., fiberglass pre-preg, bondable polymer film, and/or moisture barrier film adhesive) to form a CSA enabled to carry both power and electrical signals. Fiberglass pre-preg is readily available but, as a woven material, may allow a conductor fiber to penetrate through the weave to cause shorting or power loss. Thus, an alternative polymer insulator may further include moisture barrier film adhesive, such as a material originally intended to keep moisture from being absorbed into a honeycomb core. Moisture barrier film adhesive may be made from a thin layer of PEKK (Poly Ether Ketone Ketone), called an interleaf, and film adhesive and/or matrix resin on the sides of the PEKK. For example, a suitable off-the-shelf moisture barrier product is FM300-2 Moisture Barrier, available from Cytec. Alternatively, a moisture barrier may be hand laid up using 0.0014-inch thick PEKK and film adhesive. As seen in FIG. 2A, shield layers 214A, 214B are installed within the CSA 210 on each side of the CNT conductors to shield any noise (e.g., electromagnetic compatibility ("EMC") and EMI). In signal applications, such interference must be reduced as it may lead to weak and/or inaccurate signals. The CSA 210 (including any CNT sheet materials 204, 206) may be impregnated prior to the start of assembly (co-cured)

or may be placed into the layup using the same process for fabricating a carbon epoxy layup (co-bonded).

In addition, a conductive epoxy may be used to prevent resin flow into the CNT during impregnation while also providing for an attachment method to a PCB 202. While this method allows for connection, the process may not be ideal for a manufacturing environment and can add weight that may be avoided using alternate methods. An alternative ingress/egress approach may be to use 20 gsm NiCVD coated nonwoven carbon veil in place of conductive epoxy at ingress-egress sites on the CNT sheets. Resistance tests show that the connection performs very well. The NiCVD material may be laid up with the CNT sheets during the impregnation process. Another solution would to electroplate the ends on the CNT sheet 204 and/or yarn 206 with a metal (e.g., tin, gold, copper, etc.). This electroplating process allows for a reduced system weight in comparison to conductive epoxy and reduces the overall stack-up height (e.g., thickness) of the PCB 202 connection. Electroplating the ends of the conductors with a metal also allows for easier connection to a second conductor outside the composite structure 212. The materials for attachment of the tinned CNTs to the PCB 202 or other connector 210 should be manufactured to military specifications and/or using military materials and processes. Furthermore, methods for plating of CNT's ends prevents resin flow into the area and allow for easy attachment to PCBs or other connectors using traditional materials.

Figure 2B:
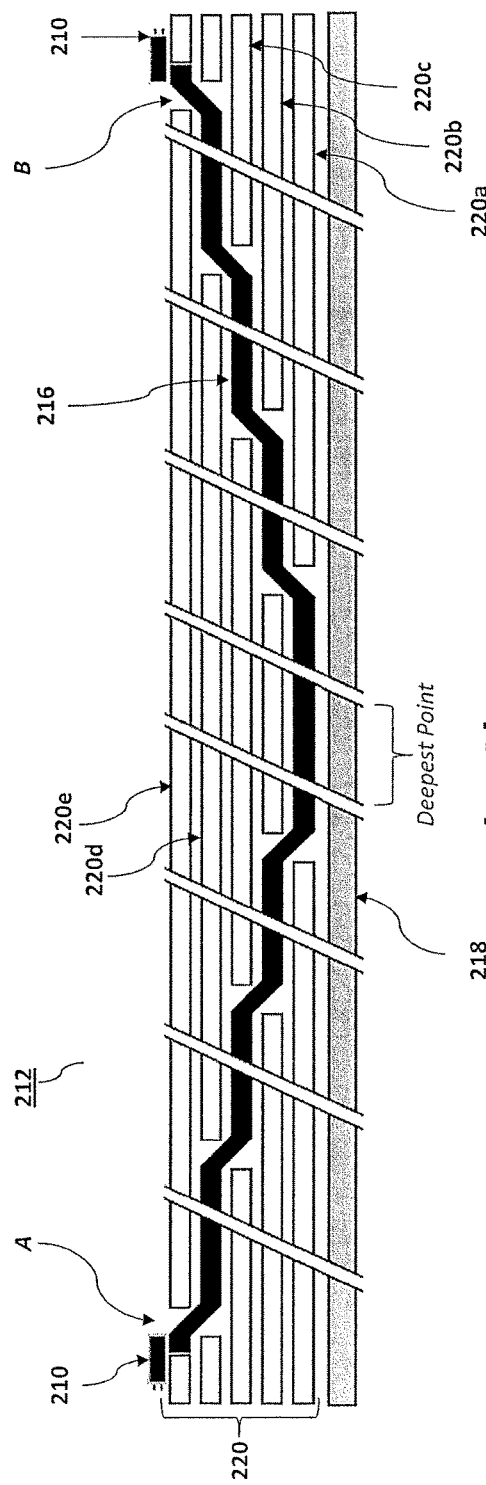
FIG. 2B illustrates a first length wise cross-sectional view of a laminate composite structure having an embedded CSA.

FIG. 2B illustrates a first length wise cross-sectional view of a laminate composite structure 212 having an embedded CSA 216. As illustrated, the laminate composite structure 212 may generally comprise a core 218, and a plurality of structural layers 220 (e.g., composite material layers 220a, 220b, 220c, 220d, 220e). The structural layers 220 may be, for example, a dry composite material, carbon pre-preg, or any other suitable composite material ply. While five structural layers 220 are illustrated, one of skill in the art would appreciate that additional, or fewer, layers 220 may be employed as desired for a particular application. Thus, the use of five layers 220 is merely illustrative and the present teachings should not be construed as limited to layups having five layers.

More specifically, FIG. 2B illustrates a technique for stepping the CSA 216 through structural layers 220, or plys, of the composite structure 212, while maintaining isolation between structural materials (e.g., the structural layers 220) and conductive material (e.g., the CSA 216 or conductors within). As discussed above, merely penetrating the various layers 220 at a single point enables moisture/debris to more easily penetrate to the core 218 of the composite structure 212, thus potentially weakening the structural integrity of the composite structure 212. However, embedding the CSA 216 in a gradual, laterally offset manner (e.g., shifting and stepping one structural layer 220 at a time) to ingress/egress through a stepping process prohibits, or mitigates, the risk of moisture/debris damage.

Figure 2C:
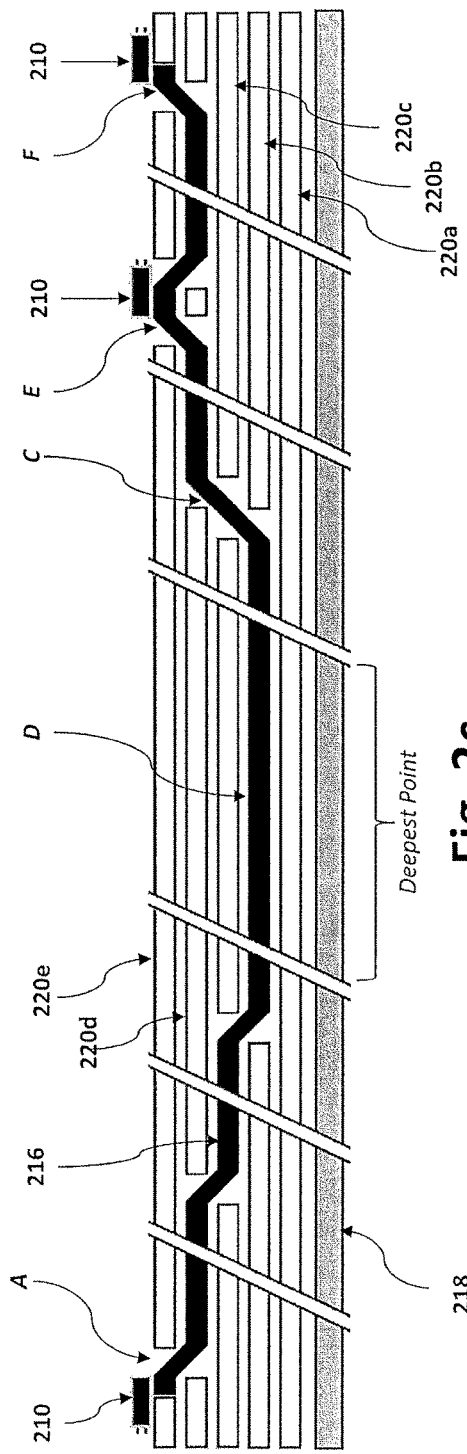
FIG. 2C illustrates a second length wise cross-sectional view of a laminate composite structure having an embedded CSA.

Throughout the stepping processes of FIGS. 2B and 2C, the CSA 216 may be configured to traverse (e.g., penetrate a layer, or "step") from one structural layer 220 to another layer 220 at a slight angle (e.g., 15 to 45 degrees) or vertically (i.e., 90 degrees, or perpendicular to the core 218). However, transitioning at a slight angle, as illustrated, can mitigate any strain associated with forming a 90 degree bend in the CSA 216.

Further, as illustrated, to maintain a substantially even thickness across a laminate composite structure 212, the CSA 216 may be approximately the same thickness as a structural layer 220 (or group of layers) such that the CSA 216 can effectively fill the void of a removed structural layer 220, or portion thereof. That is, a structural layer 220 may be effectively removed and substituted with the CSA 216 at a given depth.

Ingress Stepping.

As illustrated, a first connector 210 may be positioned at point A. The CSA 216 (which may be operatively coupled to the first connector 210 as discussed with regard to FIG. 2A) may be configured to ingress the composite structure 212 at point A, thereby inwardly traversing from the surface of the laminate composite structure 212 such that a first portion of the CSA 216 resides between fifth layer 220e and third layer 220c (i.e., occupying a void of a removed/omitted corresponding portion of the fourth layer 220d). The first portion of the portion of the CSA 216 may then travel along a predetermine length (or distance) of the laminate composite structure 212 such that the CSA 216 portion is substantially parallel to the layers 220 (and the core 218).

The CSA 216 may then inwardly traverse another layer so as such that a second portion of the CSA 216 resides between fourth layer 220d and second layer 220b. The CSA 216 may again travel along a predetermine length of the laminate composite structure 212 such that the second portion of the CSA 216 is substantially parallel to the layers 220. The CSA 216 may then inwardly traverse another layer so as such that a third portion of the CSA 216 resides between third layer 220c and first layer 220a. The CSA 216 may again travel along a predetermine length of the laminate composite structure 212 such that the third portion of the CSA 216 is substantially parallel to the layers 220. The CSA 216 may then inwardly traverse another layer so as such that a fourth portion of the CSA 216 resides between second layer 220c and core 218. In the present example, the fourth portion would be considered the deepest point of embedment.

Deepest Point.

Generally, a majority of the CSA 216's length may be embedded at the deepest point so as to maximize CSA 216 protection (e.g., from damage). Thus, the CSA 216 may again travel along a predetermine length of the laminate composite structure 212 such that the fourth portion of the CSA 216 is substantially parallel to the layers 220. Essentially, the CSA 216 may travel at the deepest point until the CSA 216 approaches an egress location (point B), at which point the ingress stepping process is repeated, but in reverse order, to egress.

While only a single span (e.g., the fourth portion) between layer traverse points is illustrated as being at the deepest point, it is contemplated that the CSA 216 may reach the deepest point, and then outwardly traverses a layer so as to avoid an obstacle, only to inwardly traverse a layer to return to the deepest point. Thus, two or more discontinuations spans between layer traverse points may be positioned at the deepest point between the ingress/egress point A and B.

Egress Stepping.

As illustrated, the CSA 216 may outwardly traverse a layer from the deepest point so as such that a fifth portion of the CSA 216 resides between third layer 220c and first layer 220a. The CSA 216 may again travel along a predetermine length of the laminate composite structure 212 such that the fifth portion of the CSA 216 is substantially parallel to the layers 220. The CSA 216 may then outwardly traverse another layer so as such that a sixth portion of the CSA 216 resides between fourth layer 220d and second layer 220b. The CSA 216 may again travel along a predetermine length of the laminate composite structure 212 such that the sixth portion of the CSA 216 is substantially parallel to the layers 220. The CSA 216 may then outwardly traverse another layer so as such that a seventh portion of the CSA 216 resides between fifth layer 220e and third layer 220c. The CSA 216 may again travel along a predetermine length of the laminate composite structure 212 such that the seventh portion of the CSA 216 is substantially parallel to the layers 220. The CSA 216 may then traverse another layer so as to egress at point B, where a second connector 210 may be positioned. The CSA 216, which may be operatively coupled to the second connector 210 as discussed with regard to FIG. 2A.

FIG. 2C illustrates a second length wise cross-sectional view of a laminate composite structure 212 having an embedded CSA 216. As illustrated at point C, depending on the need and type of composite structure, the CSA 216 may traverse two or more layers 220 at a time (e.g., vertically or at a slight angle). For instance, if a large number of layers 220 are used in manufacturing the composite structure 212, traversing the various layers one layer 220 at a time may be impractical. Further, while FIG. 2B illustrates the CSA 216 as traveling adjacent (and substantially parallel) to the core 218, the CSA 216's deepest point need not always be embedded between the core 218 and the first layer 220a. Rather, the CSA 216's deepest point may be configured between any two desired layers, thereby enabling shallow or deep embedment. For example, as illustrated in FIG. 2C at point D, the CSA 216's deepest point may be embedded between the first layer 220a and the second layer 220b. Thus, one of skill in the art would appreciate that various embedment arrangements are contemplated herein. Finally, while the connector 210 may be provided at the distal ends of the CSA 216, it is contemplated that a connector may be provided at any portion between the distal ends of the CSA 216. For example, as illustrated in FIG. 2C, a portion may egress and ingress at point E such that a connector 210 may be provided to transmit (e.g., tap) power or data signals to or from CSA 216. As illustrated, the CSA 216 may egress at point E and travel along a predetermine length of the laminate composite structure 212 such that the a portion of the CSA 216 is substantially parallel to the layers 220 before traversing one or more layers so as to egress at point F, where a third connector 210 may be positioned. This may be advantage where accessible power or surface mounted sensors need to be distributed along a surface without running a dedicated CSA 216.

To determine the mechanical capability of the embedded system of FIGS. 1 and 2A-2C, an article containing embedded CNT conductors (via, for example, a CSA 216) was tested by applying tensile and compressive strains similar to those expected during pull up of a large scale aircraft (e.g., UAV). The tests concluded that not only could the article withstand the strains when located near the neutral axis, but also could sustain the bending strains of the spar caps without increasing electrical resistance, a critical element to most electrical systems. This demonstration of strain capability indicates that the CNT embedment method of the present application has the potential to be used at any convenient location on the outer skins and spars of large scale UAVs. Testing shows the embedded system of FIGS. 1 and 2 is capable of +5000, −4000 micro-strains which is a typical strain range for aircraft skins and spars at ultimate load during maximum pull-up deflection.

Figure 3:
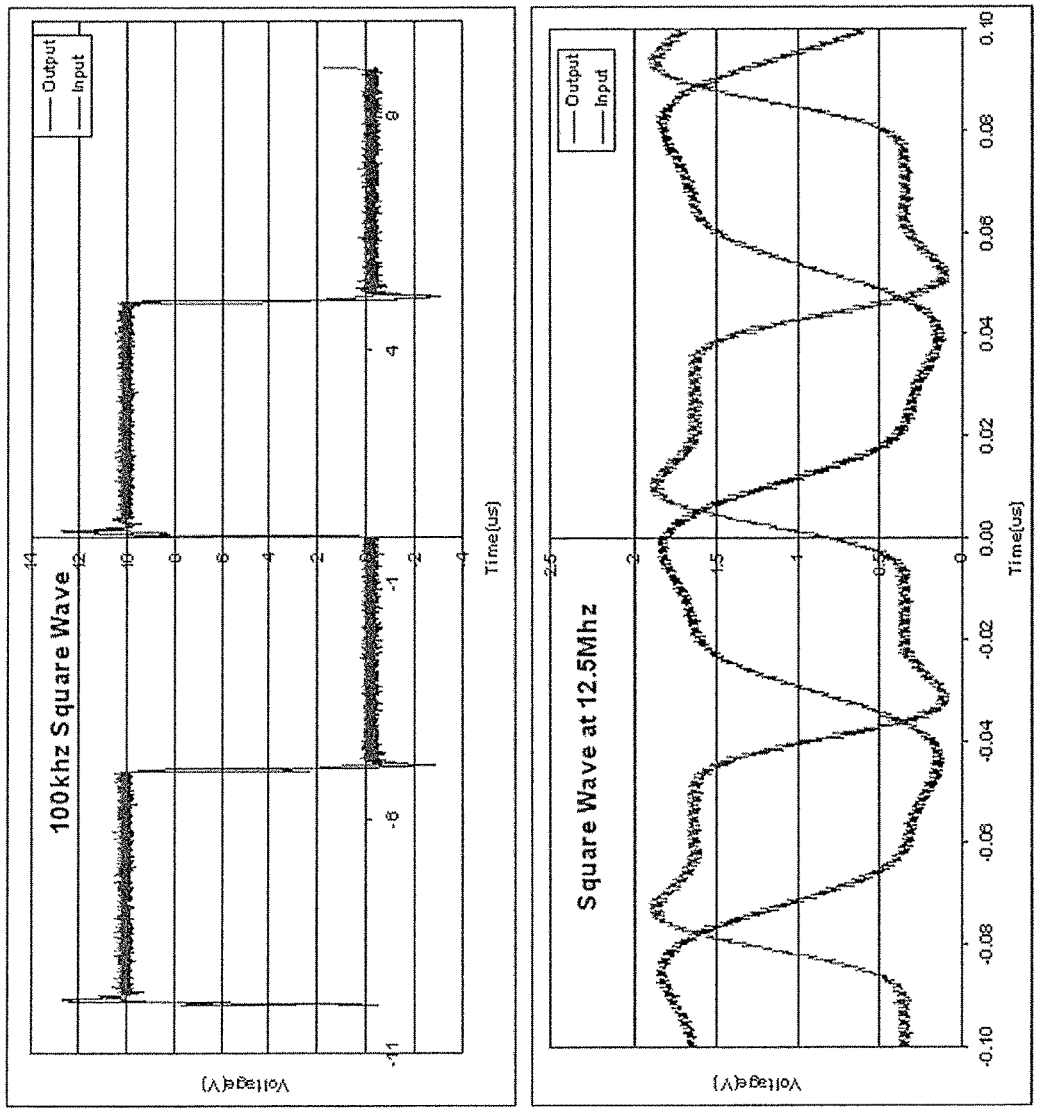
FIG. 3 depicts two graphs illustrating that embedded CNT signal performance is consistent with copper performance for both serial and 10 megabit Ethernet Systems.

An article containing embedded CNT conductors was also tested to determine signal integrity and power capability. FIG. 3 is a graph illustrating how embedded CNT signal performance is consistent with traditional copper harnessing for serial and 10 Mbit Ethernet systems. The signal waveforms were generated for serial, MIL-STD-1553, and 10 Mbit Ethernet interfaces using a 25 MHz signal generator. Signal testing shows no appreciable deviation under loading. Consistent signal performance with copper harnesses was observed up to 25 MHz for square wave input. Power testing was accomplished with a current control DC power supply and temperature sensors on the test article. Non-linear changes in current and temperature which would indicate a breakdown in the conductor or failure of the conductive epoxy were not observed. Because of the high resistivity, the CNT conductors are ideal for signal and lower power applications. Essentially, the embedded CNTs have proven to be as electrically conductive and reliable as a copper equivalent, without the deficiencies inherent to copper metal described above. At 100 kHz, the square wave output signal was virtually identical to the input signal, such that, when overlapped, the signals matched. Similarly, at 12.5 MHz, the output wave form was practically unchanged from the input signal, just shifted in the time domain.

Based on the developed conductor embedding methods and their successful results, this novel system and architecture will be a critical enhancement to future vehicular electrical systems. For example, without embeddable harnessing, it is very difficult to reliably embed strain gauges, constant voltage anemometers, temperature sensors, and other health management systems directly into composite structures. With embeddable harnessing, these sensors and networks can lead to new ways of maintaining up-to-date knowledge of airframe health, leading to enhanced preventive maintenance and system prognostics. In addition, decentralized control and aero-sensing systems can now be implemented as part of a Fly-By-Feel and UAV system that does not suffer from the CTE mismatch and material degradation of copper systems, leading to more reliable system performance.

Figure 4:
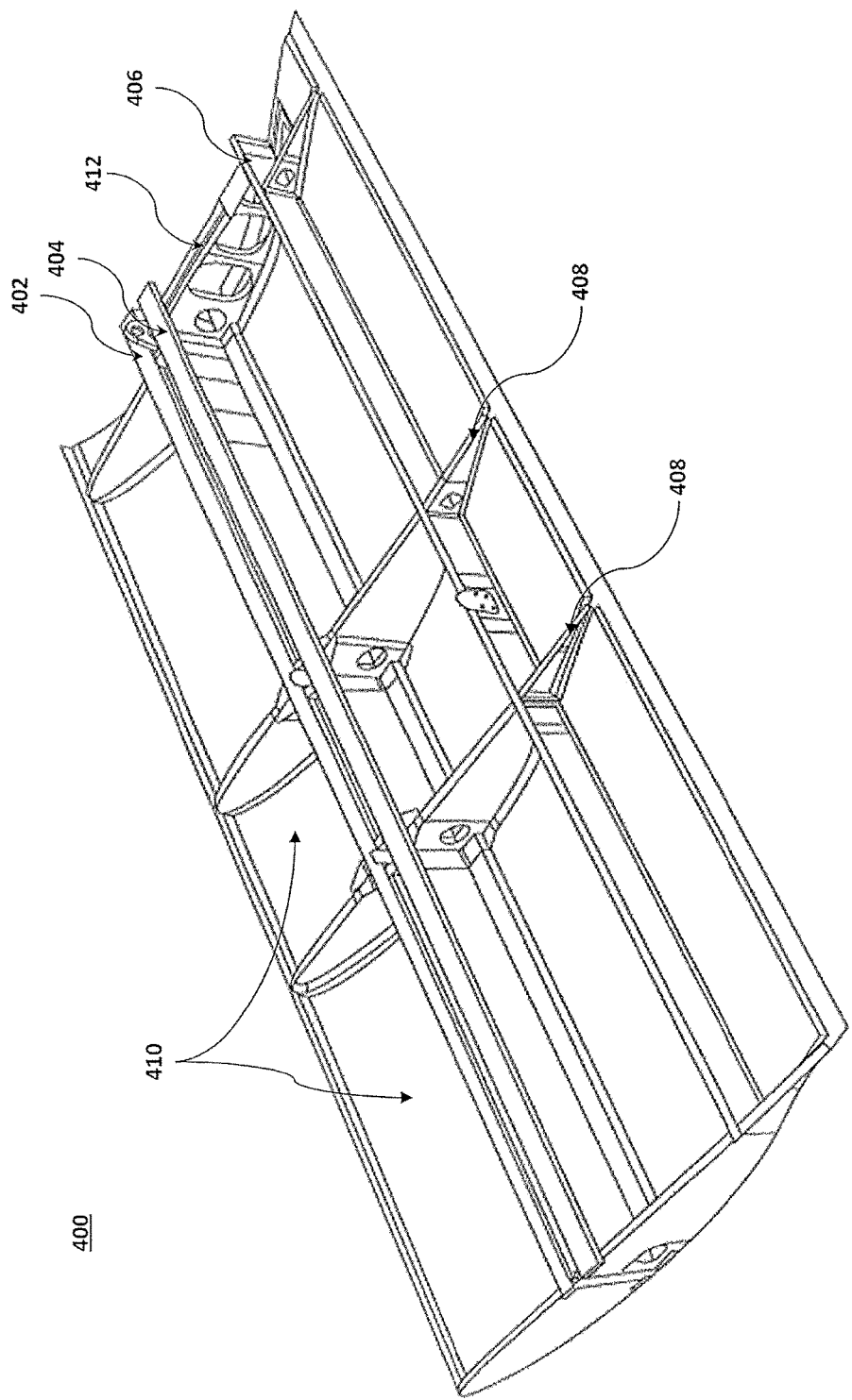
FIG. 4 depicts a section of an example aircraft wing suitable of embedded harness application.

FIG. 4 depicts a ten-foot section 400 of a typical aircraft wing (e.g., Aurora's Orion UAV). Several signal and/or power wire harnesses may be embedded in the wing area, such as engine harness controls, discretes ("kill", "safe"), accelerometers, strain sensors, and constant velocity anemometers. For example, one or more sensors may be embedded in the wing panel 410 while the CNT conductors may be installed along the leading edge 402 and main 404 spars. In certain aspects, a sensor and its leads may be sandwiched between layers of PEKK. The versatility of embedded harnesses enables embedding in and around the various ribs 408, 412 and spars 402, 404, as well as other wing structures (e.g., body panels and skins).

With embedded CNT technology, a number of sensors and their associated wiring may be installed on nearly any assessable surface of an aircraft. For example, one or more sensors may be provided throughout the vehicle to monitor/measure temperature and/or stress. Thermistors, a type of resistor whose resistance varies significantly with temperature, may be employed as an embedded temperature sensor since thermistors can be high resistance and do not require a metallic lead set. The thermistor's high resistance (e.g., 10,000Ω) reduces the error generated by the resistance of the nanomaterial lead set and reduces error due to mismatch between the two sides of the lead-set. A strain gage may be used to measure stress imparted upon the composite structure, such as foil-type strain gages, which are available from OMEGA Engineering Inc. Generally speaking, a strain gage is a sensor whose resistance varies with applied force by converting force, pressure, tension, weight, etc., into a change in electrical resistance which can then be measured and communicated to a health monitoring system. In order to minimize the thickness that the embedded sensors add to the composite structure, they are embedded within the composite structure wherein NiCVD material (in sheet form) was chosen to be the electrical lead from the sensor to outside of the composite structure. The NiCVD sheet leads may be soldered or adhered (e.g., conductive silver epoxy) to the sensors, but soldering is generally faster, cleaner, and obviates the need to wait for epoxy to cure. Testing indicated that encapsulated thermistors and strain gages are still functional after being vacuum bagged and cured to 250° F.

As with typical harness design, embedded harness design starts with a logical signal model and follows the definitions of a traditional electrical harnessing design rules. Indeed, the physical electrical embedded harness design is a cross-disciplinary activity involving both electrical and mechanical considerations. The task encompasses electrical definition of the wire gauge for proper sizing of power and signal lines using modeling of electrical characteristics cable capacitance effect, and shielding from noise EMC/EMI. Other considerations include resistance to environmental conditions and hazards, manufacturability, repair and maintainability, weight, and space saving. Generally speaking, based on existing CNT technology, the correlation between CNT and copper wire is based on weight. For example, at DC, CNT is generally twice as heavy as copper. However, at about 15 kHZ, CNT is more weight efficient than copper (not counting packaging). Moreover, volumetrically, the ratio of CNT to copper is approximately 50:1. Currently, due to size constraints, CNT is more useful as a signal carrier than a power carrier; however, may also be used to carry power provided there is space for the CNT.

Resistive Heating.

The above-described embedded conductors may further function as embedded heaters to perform de-icing and/or anti-icing functions, while also keeping the temperature of the composite within operational limits without requiring protective metal components. That is, the embedded conductors may be used to produce an embedded heater mat that is more durable than traditional heater mats. Moreover, as discussed above, the embedded heater mat preferably utilizes a compatible resin system and may be galvanically and thermally matched to the structural composite material (e.g., an aircraft's composite structure). Indeed, a heater mat may be constructed from conductors in sheet form (e.g., sheet, veil, etc.) and/or in cable form (e.g., yarns), which may be laid up in or with a composite structure using the above-described methods.

While embedded conductors were found to generate heat when transferring power from a source to a load, the amount of heat may be increased by connecting one or more of the embedded conductor across the terminals of a power supply such that the conductor becomes the load, thereby functioning as a resistor. For example, the one or more of the embedded conductors may be coupled between the power supply's positive terminal and negative terminal.

The power supply, or similar device, may be adjustable so as to control the amount of power being provided to the embedded conductors. Generally, the higher the power, the greater the temperature generated by the embedded conductor. To that end, a heater control system may be employed to automatically, or dynamically, control and monitor the embedded conductors. For example, using temperature sensors (e.g., the embedded temperature sensors), the heater control system may monitor the temperature of the heater mat to ensure that the temperature does not exceed a predetermined maximum value (e.g., the composite material's maximum temperature), wherein the power to the heater mat may be decreased or shut off if the temperature meets a predetermined warning threshold temperatures (e.g., an amount less than the predetermined maximum value). Similarly, the heater control system may be configure to keep the temperature of the heater mat at a particular temperature, or within a predetermined range of said particular temperature (e.g., permitting for certain temperature deviation).

In operation, the heater mat may be designed to cover a wide-area of a vehicle by dispersing the embedded conductors across a larger surface of a specific composite component, thus creating a wide-area heater mat. For example, when used on an aircraft, the embedded conductors may be arranged to cover a larger portion of a wing (e.g., the topside, underside, etc.), flight control surfaces (e.g., flaps, ailerons, etc.), fuselage, and the like. The wide-area heater mat may then be heated to a predetermined temperature using a power supply or other device configured to output electric current (e.g., using the embedded conductor(s) as a load). To tailor the power profile of the wide-area heater mat, the conductive materials, or layup may be customized so as to direct (i.e., concentrate) the heat to a specific area of a wide-area heater mats. For example, the orientation of plys and geometry relative to the flow of electricity may be configured to increase or decrease heat loading in specific areas as required per application. That is, to concentrate heat at the nose of the leading edge, additional conductive material may be provided at the leading edge heater; that is, the portion of the embedded conductor at the nose may be larger, or additional conductors may be provided. Moreover, layering of varying conductive material types or of varying aerial weights may be used to create custom heat profiles/signatures. For example, additional conductive material (e.g., a strip of very light weight non-woven carbon veil) may be added to a targeted region of the heater (e.g., a nose of the leading edge of a wing).

Providing additional conductive material at the targeted region lowers the resistance of the targeted region, effectively funneling power to the targeted region, thereby increasing the temperature of the targeted region relative to the other regions (non-targeted regions) of the heater pad. Thus, an operator is able to customize the heat profile of a surface by selectively turning what was a cold area into a slightly hotter area. Increasing the temperature at, for example, the leading edge of a flight surface (e.g., a wing) would be beneficial as it would better split off the built up ice at the stagnation point on the nose of the leading edge. That is, as discussed with regard to FIGS. 7a through 7c, the slightly hotter area may be a center strip (i.e., a long narrow strip) designed to splice an ice sheet at the leading edge.

Varying the resistance across a wide-area heater to generate a customized heat profile on the wide-area heater in particular advantageous where only one power input/output is available, but different areas of a structure or component have different temperatures requirements. In certain aspects, the embedded conductors of a wide-area heater may be provided as a plurality of separately controlled circuits. For example, a first area circuit may be driven with a first power value, thus generating a first temperature, while a second area circuit may be driven with a second power value, thus generating a second temperature. Further, such circuits may be switch controlled. For example, a wide-area heater may be configured with a plurality of switch controlled regions driven by a single power value, whereby one or more of the plurality of switch controlled regions of the wide-area heater may be selectively powered (e.g., activated/heated), by activating a switching device to direct power to a particular region.

In certain aspects, one or more heater mats (or wide-areas heater mats) may be provided on a surface wherein the heater control system may be configured to dynamically and independently control the various mats, so as to only supply power (or portion thereof) to the heater mats positioned in areas that are in need of heating, thus reducing unnecessary power consumption.

To test the usability of the embedded heater mat as de-icing and/or anti-icing devices, two flat panel embedded heater mat test articles were fabricated and tested. One test article used CNT material conductors (i.e., heater strips), while the second test article used NiCVD material conductors for heater strips. The CNT panel used three strips of CNT that were 14 by 2 inches with 1- by 2-inch NiCVD strips on the ingress/egress sites. One strip measured 3.5 ohms while the other two measured 3.0 ohms. The strips were also checked for any conductivity between each other. None was found. The NiCVD test panel used NiCVD strips of the same dimensions, but with additional 1- by 2-inch strips at the ingress-egress sites. The addition of embedded temperature and strain sensors added some ridges to the core side of the article, but the outside surface of the test articles remained smooth, which is ideal for the wing leading edge test article. The resistances of the heater strips were measured using a multimeter.

The heater strips were tested by applying current at the ingress-egress sights. Up to 3 amps were supplied to the heater strips, at which point the CNT strips were measured at approximately 200° F. with no sign of smoke. In using an IR camera to view the uniformity of heating through the heater strip, high concentrations of heat were noticed near the ingress-egress sights when connecting using only alligator clips, however providing an electrical connector (e.g., metal) in between the ingress-egress and the alligator strips allowed for a better distribution of the heat at the point of contact.

The tested heater strips were encased using the following layup arrangement: a film adhesive/PEKK/film adhesive barrier and embedded on one ply of fiberglass with two plys of carbon pre-preg on top of the heater strips, 0.25-inch-thick core, and finally two plys of carbon pre-preg. The ingress-egress sites were loose from the composite structure to allow for alligator clamps to be connected for resistance measurements and for current to be applied. The resistance was measure for the individual heater strips, as well as the heater strips in a parallel. In summary, the results indicated that CNT exhibited a lower resistance, while placing the conductor in parallel reduced overall resistance.

Figure 5:
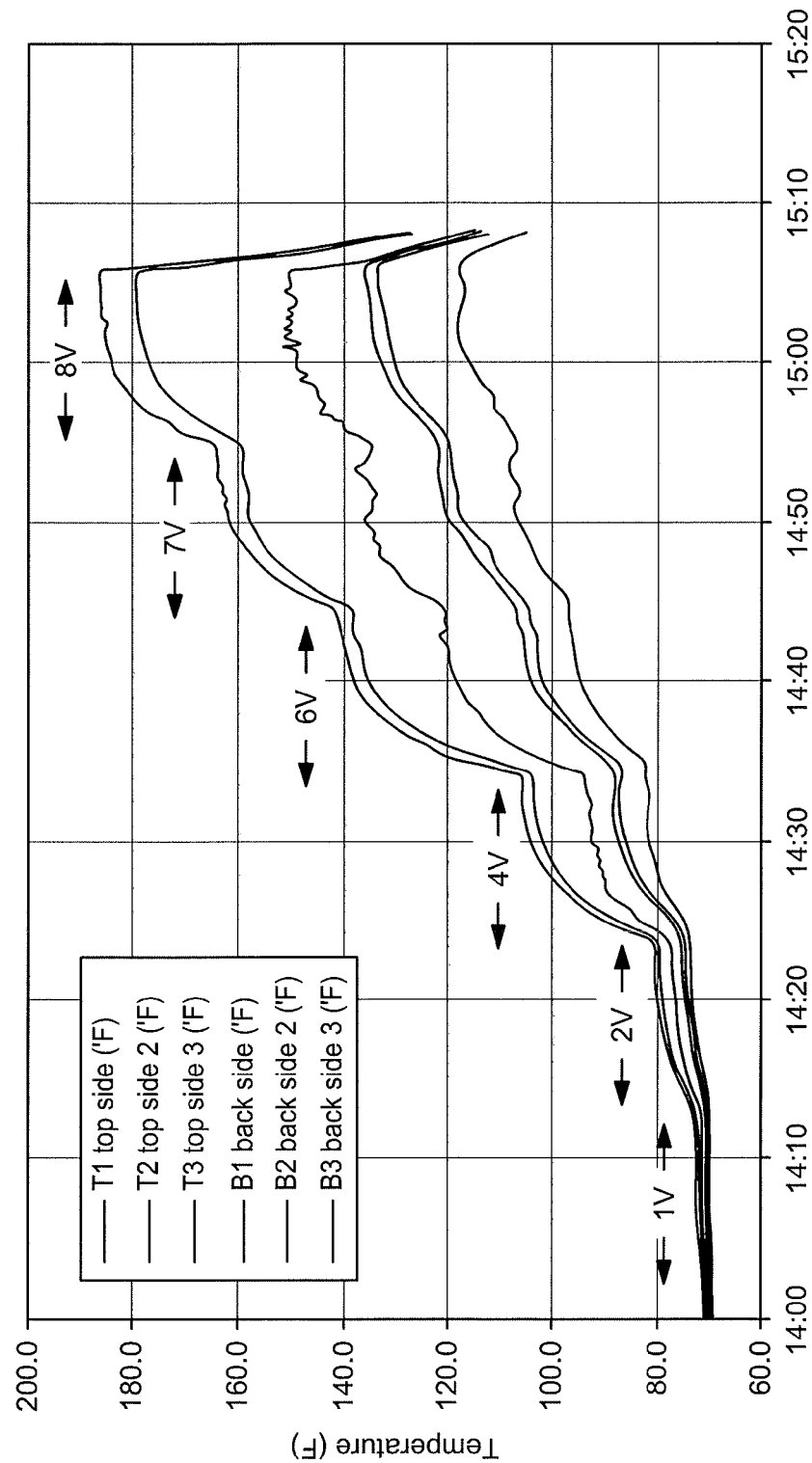
FIG. 5 is a graph illustrating an example CNT embedded heater test panel temperature rising overtime.
Figure 6:
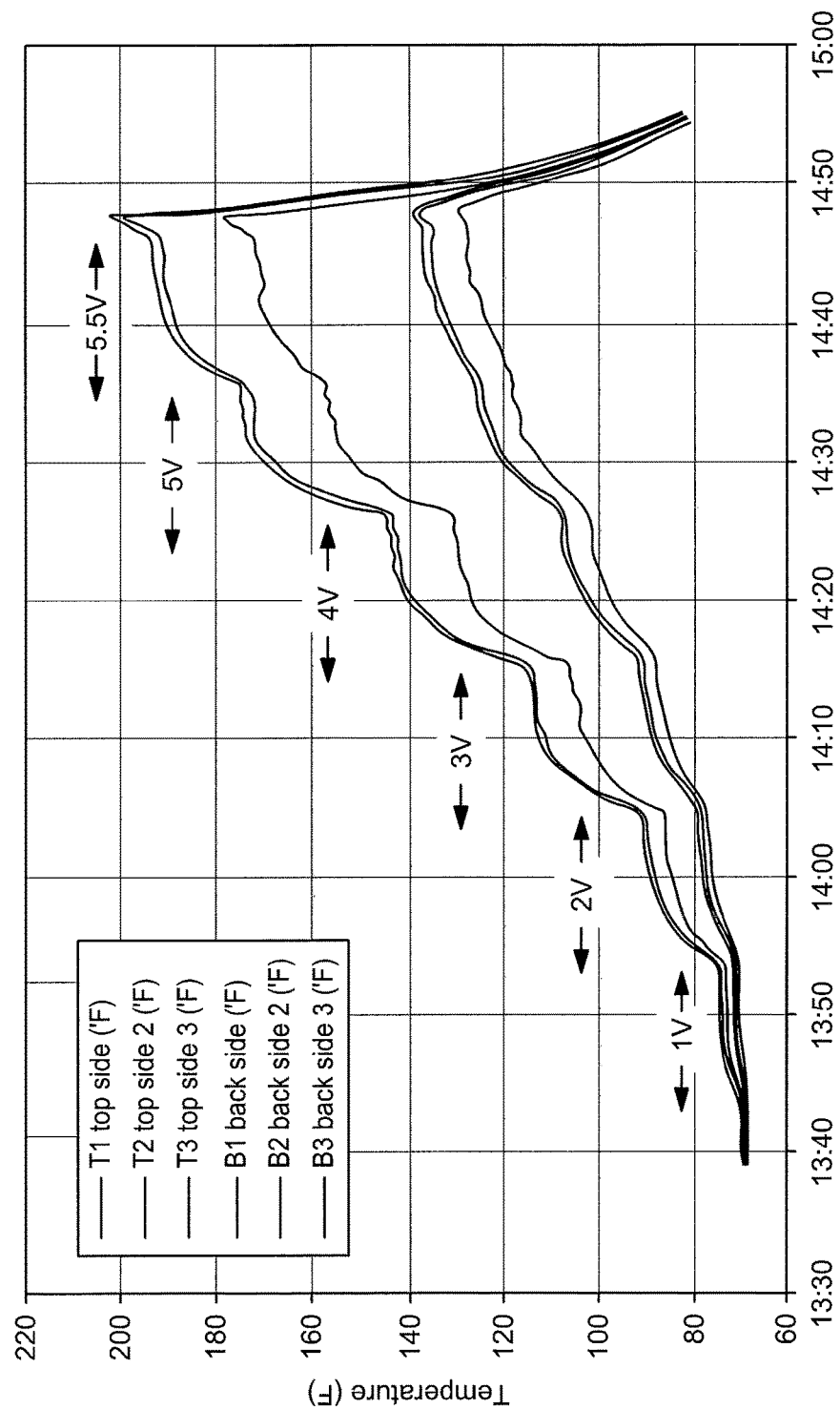
FIG. 6 is a graph illustrating an example NiCVD embedded heater test panel temperature rising overtime.

An IR camera was used while applying current to the embedded heater panels. The camera allowed for local temperature measurements that could be compared to the thermocouples that were bonded to the outside surfaces of the panels in line with the heater strips. The images also show the variance across the heater strips for a given amount of current being applied. While the NiCVD heater strips require more power to achieve the same heater strip temperature, a forward looking infrared ("FLIR") systems image comparison of the IR photographs of the CNT & NiCVD heaters during testing indicates that NiCVD heater strips tend to have a more consistent heating along the length of the heater strip, as well as fewer hot spots at the ingress-egress sites. Moreover, the effectiveness of the core as an insulator is evidenced by FIGS. 5 and 6, which show the temperature difference between the outside surface (i.e., the heater surface) and the inside surface for both the CNT and NiCVD heater strips. Specifically, FIG. 5 is a graph illustrating an example CNT embedded heater test panel temperature rising overtime while FIG. 6 is a graph illustrating an example NiCVD embedded heater test panel temperature rising overtime.

The embedded heater panels may be applied to a wing's leading edge 700. Accordingly, a test multi-functional wing 700 was designed as illustrated in FIGS. 7a through 7c. The multi-functional wing 700 employed a CSA 702 having CNT yarns as signal wires, NiCVD sheets as power cables, and carbon veil as the heater elements with the surrounding composite structure. The multi-functional wing 700 further include a leading edge and supporting structure section having embedded sensors, harness and heater elements. By highly insulating the core material, heat transfer to the interior of the airfoil may be prohibited. The airfoil leading edge was modeled as a cylinder, and standard forced convection heat transfer correlations were used to establish a heat flux boundary condition at the wing surface.

As noted above, additional conductive material may be provided at the leading edge of a multi-functional wing 700 in the form of a center strip 704 (i.e., a long narrow strip). The center strip 704 may be heated so as to split off any built up ice at the stagnation point on the nose of the leading edge. That is, the center strip 704 may be designed to heat and splice an ice sheet at the leading edge, thereby causing the ice to separate from the surface of the wing surface and fall away from the aircraft. Thus, during the leading edge layup, a center strip 704 may be placed in the very nose of the article. Further, such localized heating would be particularly useful when used in connection with an electro expulsive de-icing system (EEDS) having an electromechanical "thumper" to tap the nacelle from the inside to shed ice.

Figure 8A:
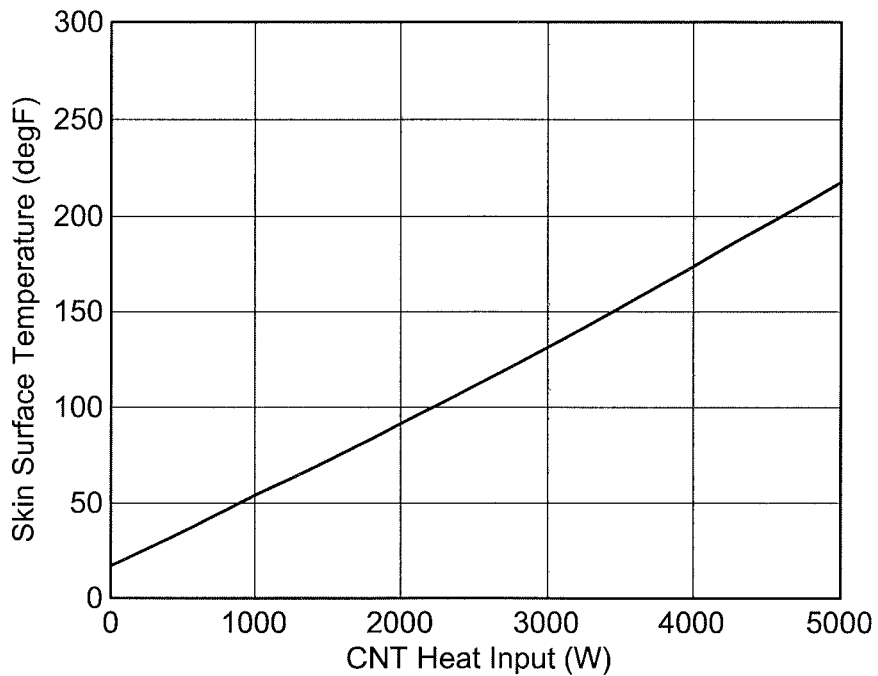
FIGS. 8a and 8b illustrate a graph of an example external surface temperature as a function of heat input.
Figure 8B:
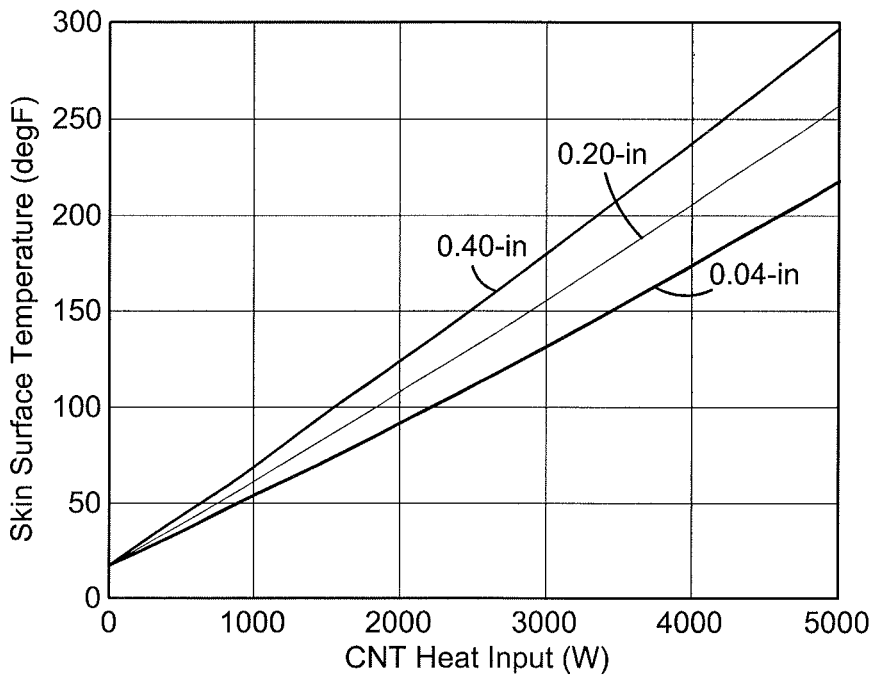

The model was configured to evaluate the effect of the fiberglass layer and ice layer thickness on the heat input requirement to achieve a temperature of 100° F. on the external surface of fiberglass layer (i.e., skin). A cylindrical geometry, approximating the wing leading edge test section, was assumed whereby the cylinder diameter was set at 6 inches and the overall length was set at 8 feet. Preliminary thermal model results are shown in FIGS. 8a and 8b. FIG. 8a plots the fiberglass skin temperature as a function of the CNT heat input for various fiberglass layer thicknesses assuming no ice layer is present. In this case, the skin surface temperature did not vary with the fiberglass thickness because it was assumed that the convective thermal resistance was constant and that no heat left the system through the interior.

The results illustrated that a heat input of approximately 2.2 kW was required to provide a skin temperature of 100° F.; on a surface area basis this worked out to be about 3.8 kW/m$^2$. At this power input condition the temperature at the interface between the CNT and the fiberglass was calculated at approximately 130° F. assuming a fiberglass layer thickness of 0.05 inch. Increasing the thickness of the fiberglass layer to 0.1 inch also increased the interface temperature (to 158° F.). Prior studies have established the maximum allowable interface temperature at about 200° F. as above this temperature the layup may begin to delaminate; this places a limit on the maximum allowable skin thickness for the layup. FIG. 8b plots the skin temperature assuming an ice layer is present on the external surface of the fiberglass layer, which is fixed at 0.05-in thick. The ice layer thickness was varied from 0.04 to 0.40 inch to represent the range of ice layer thickness typically encountered in flight. As in the prior analysis, a 100° F. skin temperature was defined as the objective condition of the analysis; however, lower temperatures may be acceptable in a de-icing application. It should be noted that phase change effects due to melting of the ice layer were not considered in the analysis. The results illustrated that the ice layer acts as an insulator dropping the heat input requirement to reach 100° F. with increasing ice thickness. At an ice thickness of 0.04 inch, the heat requirement is essentially the same as in the no ice case (2.2 kW), but at an ice thickness of 0.4 inch, the heat input requirement drops to about 1.6 kW (or about 2.7 kW/m²). FIGS. 8a and 8b depict the fiberglass surface temperature as a function of heat input through the CNT. The graph of FIG. 8a varies skin thickness with no ice layer and the graph of FIG. 8b varies ice thickness using a 0.05-inch fiberglass layer. The heat transfer analysis provided an initial estimate of the heat requirement for the airfoil de-icing/anti-icing system at between 2.7 and 3.8 kW/m².

As discussed above, ingress-egress may be accomplished using a PCB electrical connector electrically bonded to pad sites for signal cabling (e.g., 4 signal wires and 2 power wires). An alternative electrical connector may be a wire inserted directly into the layup. A benefit of this electrical connector is that it is simple to implement while also providing sufficient current distribution at the ingress-egress points such that not "hot spots" were created. Initial tests investigated using various wire gauge sizes to carry the same current ranging from a single 22 AWG wire to four 28 AWG wires. Wires were soldered to 40 gsm carbon veil with NiCVD pads. Multiple wires allowed better current distribution over the pad site and although were of greater number then a single 22 AWG wire, they were easier to solder and required less solder overall. However, because larger single wires may be required, a compromise was found by stripping the 22 AWG wire and unwinding and splaying (i.e., fanning) the individual copper strands. This was tested in two methods, one in which the copper strands were then bundled into 3 smaller pairs and one in which they remained individual splayed apart. The fanned out wires provided the same ease of soldering as well as current distribution at the pad site as the multiple wire configuration. Using minimal amounts of solder is beneficial as it reduced the risk of solder build up resulting in peaks that could protrude through glass isolation plys resulting in shorting to carbon laminate. For these reasons, ingress-egress testing used splayed out 22 AWG wire.

Eleven coupons were created all of identical geometry, but varied NiCVD pad layers, soldering, and wire strand configuration. Four plys of carbon pre-preg were used for the base material. A switch from CNT to NiCVD material was made because it was provided a better resistance match for the application. The available variability of NiCVD material and low cost makes NiCVD material extremely attractive for resistive heater applications. Additionally, NiCVD material's light weight and thinness make it relatively easy to incorporate into existing structural designs without impacting appearance and performance of the surrounding structure. FIG. 9 shows the configurations tested.

The basic conclusion from these tests was that the NiCVD material pad may not be necessary to distribute the current at the ingress-egress point when splayed wires are employed as they yielded a significant improvement over bare stripped single wire bundle. Thus, a configuration using a splayed wire directly on top of the carbon veil conductor, no solder, and no NiCVD pad may be employed.

Figure 10:
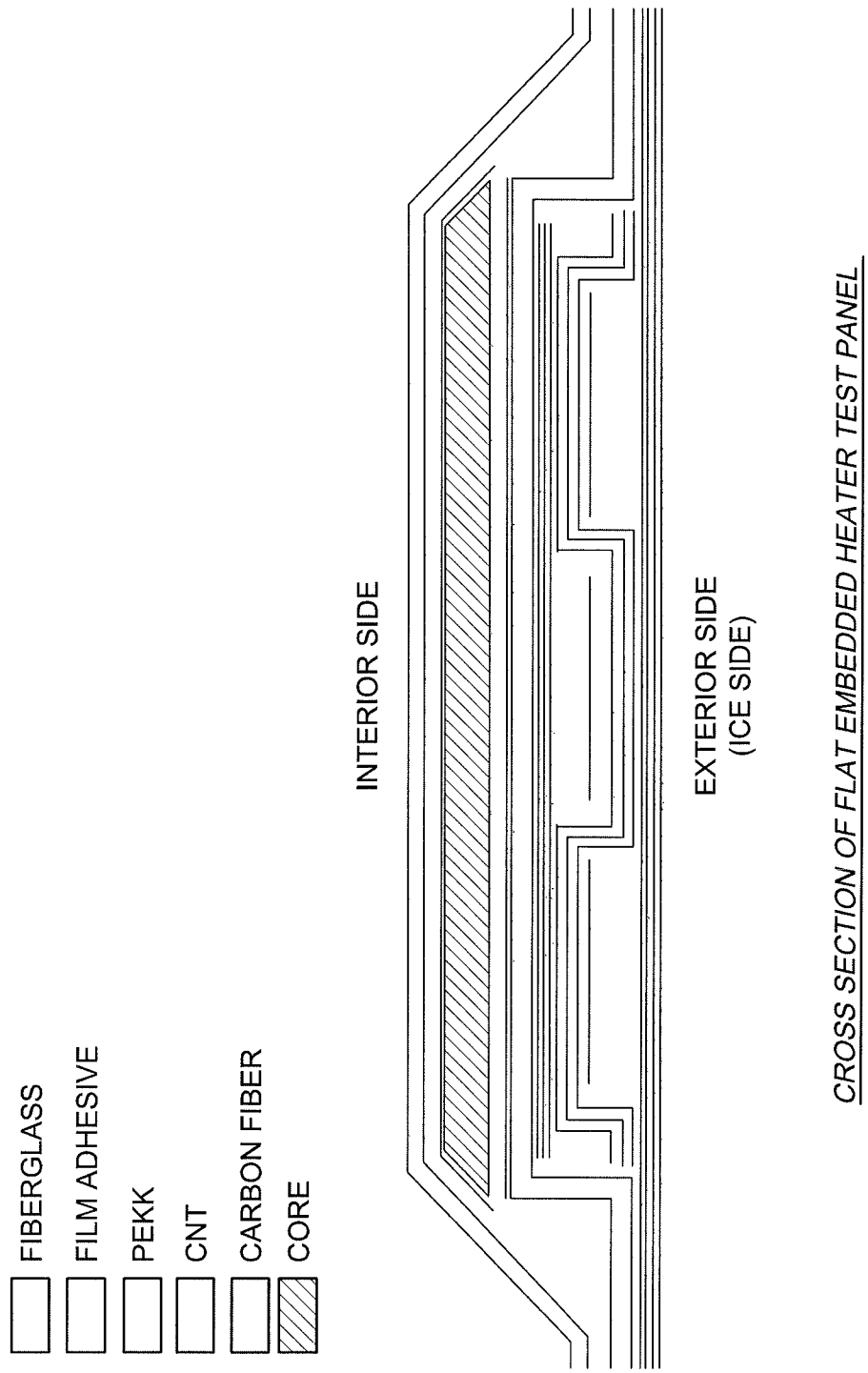
FIG. 10 illustrates an example ply layup for CNT heater strips and surrounding carbon structure.

An example configuration for facilitating proper electrical isolation between the CNT heater strips and the surrounding carbon structure is illustrated in FIG. 10, which was configured to ensure that the heater strips (i.e., the various conductors/resistors) are electronically isolated from the surrounding composite structure.

The individual components shown in outline or designated by blocks in the attached drawings are all well-known in the electrical conductance and aviation arts, and their specific construction and operation are not critical to the operation or best mode for carrying out the invention. While the description so far has centered on use in aviation, it is clear to those of skill in the art that it can equally be applied to other vehicles and vehicular systems, including, for example, automobiles, motorcycles, trains, ships, boats, spacecraft, and aircraft.

While the present embedded conductor harness technology is generally described in the context of aerial vehicles, other composite structures may similarly benefit from embedded conductor harness technology, such as automobiles, watercraft, windmill blades, helicopter blades, etc. Further, while the present invention has been described with respect to what are presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

All U.S. and foreign patent documents, all articles, brochures, and all other published documents discussed above are hereby incorporated by reference into the Detailed Description of the Preferred Embodiment.

What is claimed is:
1. A multi-functional composite structure comprising:
   a composite structure configured to pass structural loads, the composite structure having a plurality of structural composite fiber layers, each of the structural composite fiber layers comprising a matrix material;
   a connector configured to interface with one or more electrical devices;
   a composite conductor assembly electrically coupled with said connector, the composite conductor assembly having a moisture barrier resin adhesive and one or more carbon nanotube (CNT) conductors disposed between two or more insulating layers, wherein each of the two or more insulating layers comprising fiberglass,
      wherein a first portion of the composite conductor assembly is embedded between a first set of two non-adjacent layers of said plurality of structural composite fiber layers,
      wherein the first portion is substantially parallel to the first set of two non-adjacent layers,
      wherein the two or more insulating layers electrically isolate the one or more CNT conductors from said plurality of structural composite fiber layers, and
      wherein a second portion of the composite conductor assembly egresses from the multi-functional composite structure by traversing at least one of the plurality of structural composite fiber layers while maintaining electrical isolation between the composite conductor assembly's one or more CNT conductors and the plurality of structural composite fiber layers.
2. The multi-functional composite structure of claim 1, wherein said composite conductor assembly further comprises a fiber metal laminate material.

3. The multi-functional composite structure of claim 1, wherein the composite conductor assembly is stepped through each of the plurality of structural composite fiber layers.

4. The multi-functional composite structure of claim 1, wherein the composite conductor assembly is stepped through the plurality of structural composite fiber layers to egress the multi-functional composite structure.

5. The multi-functional composite structure of claim 1, wherein a third portion of the composite conductor assembly is embedded between a second set of two non-adjacent layers of said plurality of structural composite fiber layers, said second set being different from said first set.

6. The multi-functional composite structure of claim 5, wherein a fourth portion of the composite conductor assembly is embedded between a third set of two non-adjacent layers of said plurality of structural composite fiber layers, said third set being different from said first and second sets.

7. The multi-functional composite structure of claim 6, wherein (a) the first portion, (b) the third portion, and (c) the fourth portion are substantially parallel to each other.

8. The multi-functional composite structure of claim 6, wherein the third and fourth portions are substantially parallel to one or more of said plurality of structural composite fiber layers.

9. The multi-functional composite structure of claim 1, wherein the second portion is positioned at an edge of the composite conductor assembly.

10. The multi-functional composite structure of claim 1, wherein the connector is positioned at a surface of said multi-functional composite structure.

11. The multi-functional composite structure of claim 10, wherein the connector is a pad site or printed circuit board.

12. The multi-functional composite structure of claim 1, wherein the composite conductor assembly employs a resin system that is compatible with the matrix material of the composite structure.

13. The multi-functional composite structure of claim 1, wherein the one or more CNT conductors comprises a signal conductor and the composite conductor assembly further comprises a shielding material to shield the signal conductor.

14. The multi-functional composite structure of claim 1, wherein at least a portion of the composite conductor assembly is co-cured with the composite structure.

15. A method comprising the step of using the multi-functional composite structure of claim 1.

16. A load-bearing composite structure for use in a vehicle, the load-bearing composite structure comprising:
   a composite structure configured to pass structural loads, the composite structure having a plurality of structural composite fiber layers, each of the structural composite fiber layers comprising a matrix material, wherein the plurality of structural composite fiber layers includes a first, a second, and a third structural composite fiber layer, wherein the second structural composite fiber layer is layered over the third structural composite fiber layer, and the first structural composite fiber layer is layered over the second structural composite fiber layer;
   a connector configured to interface with one or more electrical devices, wherein the connector is positioned at a surface of the first structural composite fiber layer and electrically coupled to the composite conductor assembly;
   a composite conductor assembly, the composite conductor assembly having a moisture barrier resin adhesive and a plurality of carbon nanotube (CNT) conductors disposed between two or more insulating layers, said plurality of CNT conductors comprising at least one signal conductor, wherein each of the two or more insulating layers comprising fiberglass,
   wherein the composite conductor assembly further comprises a shielding material to shield the at least one signal conductor,
   wherein the two or more insulating layers electrically isolate the one or more CNT conductors from said plurality of structural composite fiber layers, and
   wherein the composite conductor assembly is stepped through the plurality of structural composite fiber layers such that
      (i) a first portion of the composite conductor assembly is embedded between, and in contact with each of the first and third structural composite fiber layers such that the first portion prevents said first and third structural composite fiber layers from contacting one another at the first portion, wherein the first portion is substantially parallel to the first and third structural composite fiber layers, and
      (ii) a second portion of the composite conductor assembly traverses the first structural composite fiber layer to egress from the multi-functional composite structure while maintaining electrical isolation between the composite conductor assembly's one or more CNT conductors and the plurality of structural composite fiber layers.

17. The load-bearing composite structure of claim 16, wherein the connector is a pad, site or printed circuit board.

18. The load-bearing composite structure of claim 16, wherein at least a portion of the composite conductor assembly is co-cured with the composite structure.

19. A load-bearing composite structure for use in a vehicle, the load-bearing composite structure comprising:
   a composite Structure configured to pass structural loads, the composite structure having a plurality of structural composite fiber layers, each of the structural composite fiber layers comprising a matrix material, wherein the plurality of structural composite fiber layers includes a first, a second, a third, and a fourth structural composite fiber layer,
      wherein the third structural composite fiber layer is layered over the fourth structural composite fiber layer, the second structural composite fiber layer is layered over the third structural composite fiber layer, and the first structural composite fiber layer is layered over the second structural composite fiber layer;
   a connector configured to interface with one or more electrical devices, wherein the connector is electrically coupled to the composite conductor assembly;
   a composite conductor assembly, the composite conductor assembly having a moisture barrier resin adhesive and one or more carbon nanotube (CNT) conductors disposed between two or more insulating layers, wherein each of the two or more insulating layers comprising fiberglass,
   wherein the two or more insulating layers electrically isolate the one or more CNT conductors from said plurality of structural composite fiber layers, and
   wherein the composite conductor assembly is stepped through the plurality of structural composite fiber layers such that
      (i) a first portion of the composite conductor assembly is embedded between, and in contact with each of, the fourth and second structural composite fiber layers, wherein the first portion is substantially parallel to the fourth and second structural composite fiber layers, (ii) a second portion of the composite conductor assembly is embedded between, and in contact with each of, the third and first structural composite fiber layers, wherein the first portion is substantially parallel to the third and first structural composite fiber layers, and (iii) a third portion of the composite conductor assembly traverses the first structural composite fiber layer to egress from the multi-functional composite structure while maintaining electrical isolation between the composite conductor assembly's one or more CNT conductors and each of the plurality of structural composite fiber layers.

20. The load-bearing composite structure of claim 19, wherein at least one of said one or more CNT conductors comprises a carbon nanotube material.

21. The load-bearing composite structure of claim 19, wherein said one or more CNT conductors and said two or more insulating layers are provided using a fiber metal laminate material.

22. The load-bearing composite structure of claim 19, wherein the connector is positioned at a surface of said multi-functional composite structure.

23. The load-bearing composite structure of claim 19, wherein at least a portion of the composite conductor assembly is co-cured with the composite structure.

24. The load-bearing composite structure of claim 19, wherein the connector is a printed circuit board.

25. The load-bearing composite structure of claim 19, wherein the one or more CNT conductors comprises a signal conductor and the composite conductor assembly further comprises a shielding material to shield the signal conductor.

\* \* \* \* \*